US008089202B2

(12) United States Patent
Kobayashi

(10) Patent No.: US 8,089,202 B2
(45) Date of Patent: Jan. 3, 2012

(54) PIEZOELECTRIC VIBRATING REED, PIEZOELECTRIC VIBRATOR, OSCILLATOR, ELECTRONIC DEVICE, RADIO-CONTROLLED CLOCK, AND METHOD FOR MANUFACTURING PIEZOELECTRIC VIBRATING REED

(75) Inventor: Takashi Kobayashi, Chiba (JP)

(73) Assignee: Seiko Instruments Inc., Chiba (JP)

( * ) Notice: Subject to any disclaimer, the term of this patent is extended or adjusted under 35 U.S.C. 154(b) by 0 days.

(21) Appl. No.: 12/839,942

(22) Filed: Jul. 20, 2010

(65) Prior Publication Data

US 2011/0018402 A1 Jan. 27, 2011

(30) Foreign Application Priority Data

Jul. 21, 2009 (JP) .................................. 2009-170381

(51) Int. Cl.
H03H 9/21 (2006.01)
H03H 9/215 (2006.01)
H01L 41/047 (2006.01)
H01L 41/053 (2006.01)
(52) U.S. Cl. ........ 310/370; 310/365; 310/340; 310/348; 310/349
(58) Field of Classification Search .................. 310/340, 310/348, 349, 365, 366, 370
See application file for complete search history.

(56) References Cited

U.S. PATENT DOCUMENTS

| 7,863,803 | B2 * | 1/2011 | Yamada et al. | 310/370 |
|---|---|---|---|---|
| 2009/0127983 | A1 * | 5/2009 | Hirasawa | 310/370 |
| 2011/0018403 | A1 * | 1/2011 | Kobayashi | 310/370 |
| 2011/0221311 | A1 * | 9/2011 | Iwai | 310/370 |

FOREIGN PATENT DOCUMENTS

JP 2004-120556 A 4/2004

* cited by examiner

*Primary Examiner* — Thomas Dougherty
(74) *Attorney, Agent, or Firm* — Brinks Hofer Gilson & Lione

(57) ABSTRACT

Providing a piezoelectric vibrating reed which has low disconnection possibility and ensures reliability for stable operation without requiring strict exposure position accuracy. A piezoelectric vibrating reed 1 including: a piezoelectric plate which includes vibrating arms 3 and 4, a base portion 5 to which base ends of vibrating arms are integrally fixed, and groove portions 6 which are formed on principal surfaces of vibrating arms; and excitation electrodes 10 and 11 to which vibrating arms are vibrate, wherein the excitation electrodes each include: a principal electrode portion 20, a side electrode portion 21 and a connection electrode portion 22, wherein the principal electrode portions are formed such that a horizontal width W1 on the base end sides of the vibrating arms is smaller than a horizontal width W2 in other portions so that a vacant area S is secured on a portion of the principal surface of each of the vibrating arms in the vicinity of a fork portion 15, and wherein the connection electrode portion is formed to have a large width on the principal surface of each of the vibrating arms so as to come close to an opening end side of each of the groove portions by occupying the vacant area.

9 Claims, 18 Drawing Sheets

PIEZOELECTRIC VIBRATING REED, PIEZOELECTRIC VIBRATOR, OSCILLATOR, ELECTRONIC DEVICE, RADIO-CONTROLLED CLOCK, AND METHOD FOR MANUFACTURING PIEZOELECTRIC VIBRATING REED

RELATED APPLICATIONS

This application claims priority under 35 U.S.C. §119 to Japanese Patent Application No. 2009-170381 filed on Jul. 21, 2009, the entire content of which is hereby incorporated by reference.

BACKGROUND OF THE INVENTION

1. Field of the Invention

The present invention relates to a piezoelectric vibrating reed made of a piezoelectric material, such as quartz or lithium tantalate, a piezoelectric vibrator having the piezoelectric vibrating reed, and an oscillator, an electronic device, and a radio-controlled clock each having the piezoelectric vibrator, as well as a manufacturing method of the piezoelectric vibrating reed.

2. Description of the Related Art

Recently, a piezoelectric vibrator utilizing quartz or the like is used in a cellular phone and a portable information terminal as the time source, the timing source of a control signal, a reference signal source, and the like. The piezoelectric vibrator of this type is proposed in a variety of forms, and a piezoelectric vibrator having a turning-fork type piezoelectric vibrating reed is one example. This piezoelectric vibrating reed is a vibrating reed that allows a pair of vibrating arms disposed in parallel to each other to vibrate at a predetermined resonance frequency in a direction to move closer to or away from each other.

As represented by cellular phones, various electronic devices having the piezoelectric vibrator have become smaller in recent years. Accordingly, there is a demand for the piezoelectric vibrating reed of the piezoelectric vibrator to be further reduced in size. Therefore, the piezoelectric vibrating reed is expected to have a structure such that the length of the vibrating arm or base portion thereof is decreased so as to have a shorter total length.

However, when the total length of the piezoelectric vibrating reed is reduced by decreasing the length of the base portion, mounting performance thereof will decrease, and the vibrating arm is likely to vibrate unstably. Thus, vibration loss (leakage of vibration energy) through the base portion can occur easily. For this reason, there is concern about increasing the CI value (crystal impedance). Particularly, since there is an influence of vibration loss, the method of decreasing the length of the base portion is not considered a practically effective method.

Therefore, in order to achieve miniaturization by decreasing the total length of the piezoelectric vibrating reed, it is effective to decrease the length of the vibrating arm rather than the base portion. However, when the length of the vibrating arm is decreased, the R1 value (series resonance resistance value) increases and the vibration characteristics tend to deteriorate. Particularly, since the R1 value is proportional to the effective resistance value Re, if the R1 value increases, it is difficult to operate the piezoelectric vibrating reed at low power.

Therefore, in order to reduce the R1 value, JP-A-2004-120556 discloses a piezoelectric vibrating reed in which groove portions are formed on both principal surfaces (top and back surfaces) of a pair of vibrating arms along the longitudinal direction of the vibrating arms.

This piezoelectric vibrating reed is formed such that the pair of vibrating arms have an H-type section due to the presence of the groove portions, so that excitation electrodes face each other at a very small distance. For this reason, compared with a case where no groove portions are formed, an electric field can be applied more efficiently and vibration loss can be reduced. Therefore, it is possible to improve vibration characteristics and suppress the R1 value to a low value.

As described above, in order to achieve miniaturization of the piezoelectric vibrating reed while suppressing an increase of the R1 value, it is an effective means to form groove portions in the vibrating arms and decrease the lengths of the vibrating arms.

However, since the groove portions are formed on the principal surfaces of the vibrating arms, the surface area of the principal surfaces of the vibrating arms will decrease. For this reason, the electrode pattern is likely to have a fine pitch, and thus, there is a high risk of midway disconnection during the patterning. This will be described in detail below.

As shown in FIG. 24, a piezoelectric vibrating reed 200 includes a pair of excitation electrodes 203 formed in a pair of vibrating arms 201a and 201b, a mount electrode 204 formed in a base portion 202, and an extraction electrode 205 connecting the mount electrode 204 and the pair of excitation electrodes 203 together.

Among these electrodes, the pair of excitation electrodes 203 are electrodes that allow the pair of vibrating arms 201a and 201b to vibrate in a direction to move closer to and away from each other when a predetermined voltage is applied thereto via the mount electrode 204. One excitation electrode 203 is mainly formed on the groove portion 206 of one vibrating arm 201a and on both side surfaces of the other vibrating arm 201b. The other excitation electrode 203 is mainly formed on the groove portion 206 of the other vibrating arm 201b and both side surfaces of one vibrating arm 201a.

Moreover, the excitation electrode 203 formed on the side surfaces of one vibrating arm 201a is patterned on the groove portion 206 of the other vibrating arm 201b after being led out towards the principal surface of the base portion 202 at the vicinity of a fork portion 207.

The respective electrodes are patterned by exposure through a mask. For this reason, in order to perform patterning at high accuracy, high exposure position accuracy is required.

However, in practical cases, the exposure position accuracy will have errors due to mask positioning accuracy or lens aberrations during exposure. Therefore, the electrode patterns may be shifted from desired positions. Particularly, when the electrode patterns are shifted in the direction indicated by the arrow A in FIG. 24, a lead-out portion 210 of the excitation electrode 203 led out from the side surface of the vibrating arm 201a towards the principal surface of the base portion 202 will be caught at the fork portion 207 as shown in FIG. 25. Since the fork portion 207 is a portion where an uneven surface can occur easily, it is generally difficult to form electrodes on the fork portion. For this reason, the excitation electrodes 203 may be disconnected at the fork portion 207, and the excitation electrodes 203 formed on the side surfaces of one vibrating arm 201a are not connected to the groove portion 206 of the other vibrating arm 201b.

When the excitation electrodes 203 are disconnected midway, the vibrating arms 201a and 201b will not vibrate, resulting in defective units. Therefore, when exposure is performed, it is necessary to align the exposure positions with strictly high accuracy so that the excitation electrodes are not disconnected at the fork portion 207. For this reason, it is difficult to achieve high manufacturing efficiency.

SUMMARY OF THE INVENTION

The present invention has been made in view of the foregoing, and an object of the present invention is to provide a piezoelectric vibrating reed which has low disconnection possibility and ensures reliability for stable operation without requiring strict exposure position accuracy.

Another object of the present invention is to provide a method for manufacturing the piezoelectric vibrating reed, a piezoelectric vibrator having the piezoelectric vibrating reed, and an oscillator, an electronic device, and a radio-controlled clock each having the piezoelectric vibrator.

The present invention provides the following means in order to solve the problems.

According to an aspect of the present invention, there is provided a piezoelectric vibrating reed including: a piezoelectric plate which includes a pair of vibrating arms disposed in parallel to each other, a base portion to which base ends of the pair of vibrating arms are integrally fixed, and groove portions which are formed on principal surfaces of the pair of vibrating arms so as to extend in a vertical direction with constant width from the base ends of the vibrating arms towards the tip ends thereof; and excitation electrodes which are formed on an outer surface of the piezoelectric plate and allow the pair of vibrating arms to vibrate when a voltage is applied thereto, wherein the excitation electrodes each include: principal electrode portions which are formed in the groove portions and on portions of the principal surfaces of the vibrating arms surrounding the groove portions; side electrode portions which are formed on side surfaces of the vibrating arms; and a connection electrode portion which is formed on the principal surfaces of the vibrating arms to be connected to the side electrode portions and which is connected to the principal electrode portions disposed on the one vibrating arm after being led out towards the other vibrating arm via the principal surface of the base portion, wherein the principal electrode portions are formed such that a horizontal width on the base end sides of the vibrating arms is smaller than a horizontal width in other portions so that a vacant area is secured on a portion of the principal surface of each of the vibrating arms in the vicinity of a fork portion, and wherein the connection electrode portion is formed to have a large width on the principal surface of each of the vibrating arms so as to come close to an opening end side of each of the groove portions by occupying the vacant area.

According to another aspect of the present invention, there is provided a method for manufacturing a plurality of piezoelectric vibrating reeds at a time using a wafer made of a piezoelectric material, the method including: an outer shape forming step of etching the wafer by a photolithography technique to form the outer shape of a plurality of piezoelectric plates each including a pair of vibrating arms disposed in parallel to each other and a base portion to which base ends of the pair of vibrating arms are integrally fixed; a groove forming step of forming groove portions which are formed on principal surfaces of the pair of vibrating arms so as to extend in a vertical direction with a constant width from the base ends of the vibrating arms towards tip ends thereof; an electrode forming step of patterning an electrode film on the outer surfaces of the plurality of piezoelectric plates by performing exposure through a mask to form excitation electrodes which allow the pair of vibrating arms to vibrate when a voltage is applied thereto; and a cutting step of separating the plurality of piezoelectric plates from the wafer to obtain small fragments, wherein, during the electrode forming step, the excitation electrodes are formed so as to include: principal electrode portions which are formed in the groove portions and on portions of the principal surfaces of the vibrating arms surrounding the groove portions; side electrode portions which are formed on side surfaces of the vibrating arms; and a connection electrode portion which is formed on the principal surfaces of the vibrating arms to be connected to the side electrode portions and which is connected to the principal electrode portions disposed on the one vibrating arm after being led out towards the other vibrating arm via the principal surface of the base portion, wherein the principal electrode portions are formed such that a horizontal width on the base end sides of the vibrating arms is smaller than a horizontal width in other portions so that a vacant area is secured on a portion of the principal surface of each of the vibrating arms in the vicinity of a fork portion, and wherein the connection electrode portion is formed so as to have a large width on the principal surface of each of the vibrating arms so as to come close to an opening end side of each of the groove portions by occupying the vacant area.

In the piezoelectric vibrating reed and the manufacturing method of the piezoelectric vibrating reed according to the aspects of the present invention, the outer shape forming step is performed where a wafer made of a piezoelectric material such as quartz is etched by a photolithography technique to form the outer shape of a plurality of piezoelectric plates on the wafer. At this time, the outer shape is formed such that each piezoelectric plate includes a pair of vibrating arms and a base portion to which base ends of the pair of vibrating arms are integrally fixed.

Subsequently, groove portions are formed on the principal surfaces of the pair of vibrating arms. At this time, the groove portions are formed so as to extend in a vertical direction with a constant width from the base ends of the vibrating arms toward the tip ends thereof. In this way, it is possible to obtain the vibrating arms having an H-type section.

Subsequently, the electrode forming step is performed where an electrode film is patterned on the outer surfaces of the plurality of piezoelectric plates by performing exposure through a mask to form excitation electrodes. Thereafter, the cutting step is performed where the plurality of piezoelectric plates are separated from the wafer to obtain small fragments. In this way, a plurality of turning-fork type piezoelectric vibrating reeds can be manufactured from one wafer at a time.

When the electrode forming step is performed, the excitation electrodes are formed so as to have principal electrode portions, side electrode portions, and a connection electrode portion by exposure. Specifically, the principal electrode portions are formed in the groove portions and on portions of the principal surfaces of the vibrating arms surrounding the groove portions. Moreover, the side electrode portions are formed on the side surfaces of the vibrating arms. The connection electrode portion is formed on the principal surfaces of the vibrating arms to be connected to the side electrode portions and which is connected to the principal electrode portions disposed on the one vibrating arm after being led out towards the other vibrating arm via the principal surface of the base portion.

In this way, the principal electrode portion disposed on the one vibrating arm can be connected to the side electrode portion disposed on the other vibrating arm by the connection electrode portion. Moreover, the side electrode portion disposed on the one vibrating arm can be connected to the principal electrode portion disposed on the other vibrating arm by the connection electrode portion.

As a result, it is possible to form excitation electrodes which allow the pair of vibrating arms to vibrate when a voltage is applied thereto.

In particular, the principal electrode portions are formed such that in a top view thereof, a horizontal width on the base end sides of the vibrating arms (the length in the lateral direction of each of the vibrating arms) is smaller than the horizontal width in other portions. That is to say, the principal electrode portions do not have a uniform horizontal width along the longitudinal direction of the vibrating arms but have a smaller horizontal width on the base end side of the vibrating arms, namely in the vicinity of the fork portion. With this configuration, vacant areas where the principal electrode portions are not formed are secured on portions of the principal surfaces of the vibrating arms in the vicinity of the fork portion.

The connection electrode portion is formed to have a large width on the principal surface of each of the vibrating arms so as to come close to an opening end side of each of the groove portions by occupying the vacant area. That is to say, the connection electrode portion is formed to have a great horizontal width in the vicinity of the fork portion by occupying the vacant area.

Therefore, even when the formation position of the connection electrode portion is slightly shifted towards the fork portion in the lateral direction of the vibrating arms at the time of exposure, the connection electrode portion can be formed securely on the principal surfaces of the vibrating arms in the vicinity of the fork portion. That is to say, even when exposure position accuracy is not strict as in the related art, the connection electrode portion can be formed on the peripheral surfaces of the vibrating arms in the vicinity of the fork portion. For this reason, it is possible to achieve a reliable connection between the connection electrode portion and the side electrode portions. Therefore, it is possible to reduce the disconnection possibility and ensure reliability for stable operation of the vibrating reed. Moreover, since the disconnection possibility can be reduced without requiring such strict exposure position accuracy, it is possible to improve manufacturing efficiency and achieve cost-reduction.

In the piezoelectric vibrating reed according to the above aspect of the present invention, the connection electrode portion may be formed to have a large width within a range of 100 μm and 200 μm from the base ends of the vibrating arms towards the tip ends.

In the manufacturing method of the piezoelectric vibrating reed according to the above aspect of the present invention, during the electrode forming step, the connection electrode portion may be formed to have a large width within a range of 100 μm and 200 μm from the base ends of the vibrating arms towards the tip ends.

In the piezoelectric vibrating reed and the manufacturing method of the piezoelectric vibrating reed according to the aspects of the present invention, the connection electrode portion is formed on the principal surfaces of the vibrating arms over a range of at least 100 μm from the base ends of the vibrating arms, namely the fork portion, to the tip ends of the vibrating arms. For this reason, even when the formation position of the connection electrode portion is slightly shifted towards the fork portion in the lateral direction of the vibrating arms at the time of exposure, it is possible to connect the connection electrode portion and the side electrode portions together over a sufficient length and to thus reduce the disconnection possibility further.

Moreover, since the length of the connection electrode portion is 200 μm or less, it is possible to decrease the length of the principal electrode portions having a small width as much as possible. Particularly, since the greater the horizontal width of the principal electrode portion, the better the R1 value can be reduced, by decreasing the length of the small-width portion as much as possible, it becomes easy to suppress the R1 value to a low value and to improve the vibration characteristics.

In the piezoelectric vibrating reed according to the above aspect of the present invention, the connection electrode portion may be formed such that the large-width portion has a horizontal width of at least 10 μm.

In the manufacturing method of the piezoelectric vibrating reed according to the above aspect of the present invention, during the electrode forming step, the connection electrode portion may be formed such that the large-width portion has a horizontal width of at least 10 μm.

In the piezoelectric vibrating reed and the manufacturing method of the piezoelectric vibrating reed according to the aspects of the present invention, the large-width portion of at least 10 μm is secured for the connection electrode portion. When electrodes are formed by exposure using a mask, the exposure position accuracy is typically set to approximately ±4 to 5 μm. Therefore, even when the formation position of the connection electrode portion is shifted by a distance 5 μm towards the fork portion in the lateral direction of the vibrating arms at the time of exposure, the connection electrode portion can be securely formed on the principal surfaces of the vibrating arms in the vicinity of the fork portion. Therefore, the disconnection possibility can be reduced further.

According to a further aspect of the present invention, there is provided a piezoelectric vibrator including the piezoelectric vibrating reed according to the above aspect of the present invention.

In the piezoelectric vibrator according to the above aspect of the present invention, since the piezoelectric vibrator includes the piezoelectric vibrating reed which has a low disconnection possibility and ensures reliability for stable operation, it is possible to obtain a high-quality piezoelectric vibrator having improved reliability.

In the piezoelectric vibrator according to the above aspect of the present invention, the piezoelectric vibrator may include: a base board mounting the piezoelectric vibrating reed on an upper surface thereof; a lid board bonded to the base board in a state where the mounted piezoelectric vibrating reed is accommodated in a cavity; and a pair of outer electrodes that are formed on a lower surface of the base board and electrically connected to the excitation electrodes of the mounted piezoelectric vibrating reed.

In the piezoelectric vibrator according to the above aspect of the present invention, the piezoelectric vibrating reed is accommodated in a cavity that is formed between the base board and the lid board being bonded to each other. At this time, the piezoelectric vibrating reed is mounted on the upper surface of the base board in a state of being electrically connected to the pair of outer electrodes. With this configuration, since a voltage can be applied to the excitation electrodes by applying a voltage to the pair of outer electrodes, the pair of vibrating arms can be vibrated.

Particularly, since the piezoelectric vibrator can be configured as a packaged piezoelectric vibrator of the surface-mounting type in which the piezoelectric vibrating reed is hermetically sealed in the cavity, it is possible to allow the piezoelectric vibrating reed to vibrate without being affected by dust or the like and achieve highly accurate vibration of the piezoelectric vibrating reed. In addition, since the piezoelectric vibrator is a surface-mounting type piezoelectric vibrator, the piezoelectric vibrator can be mounted easily and has excellent stability after being mounted.

In the piezoelectric vibrator according to the above aspect of the present invention, the piezoelectric vibrator may include: a case that accommodates therein the piezoelectric vibrating reed; and an airtight terminal that hermetically seals the inside of the case, wherein the airtight terminal includes: a stem that is formed in a ring-like shape and press-fit to be fixed to the inside of the case; two lead terminals which are disposed in a state of penetrating through the stem while interposing the stem therebetween, in which one ends thereof serve as inner leads electrically connected to the excitation electrodes, and the other ends thereof serve as outer leads electrically connected to the outside; and a filling member that fixes the lead terminals and the stem.

In the piezoelectric vibrator according to the above aspect of the present invention, the piezoelectric vibrating reed is accommodated in a case that is hermetically sealed by the airtight terminal. At this time, the piezoelectric vibrating reed is mounted by the lead terminals in a state where the excitation electrodes are electrically connected to the inner leads of the two lead terminals. With this configuration, since a voltage can be applied to the excitation electrodes by applying a voltage to the outer leads of the two lead terminals, the pair of vibrating arms can be vibrated.

Particularly, since the piezoelectric vibrator can be configured as a cylinder-packaged piezoelectric vibrator in which the piezoelectric vibrating reed is hermetically sealed in the case, it is possible to allow the piezoelectric vibrating reed to vibrate without being affected by dust or the like and achieve highly accurate vibration of the piezoelectric vibrating reed.

According to a still further aspect of the present invention, there is provided an oscillator in which the piezoelectric vibrator according to the above aspect of the present invention is electrically connected to an integrated circuit as an oscillating piece.

According to a still further aspect of the present invention, there is provided an electronic device in which the piezoelectric vibrator according to the above aspect of the present invention is electrically connected to a time counting portion.

According to a still further aspect of the present invention, there is provided a radio-controlled clock in which the piezoelectric vibrator according to the above aspect of the present invention is electrically connected to a filter portion.

In the oscillator, electronic device, and radio-controlled clock according to the above aspect of the present invention, since they have the piezoelectric vibrator described above, it is possible to achieve improvement in reliability and high quality.

According to the piezoelectric vibrating reed and the manufacturing method of the piezoelectric vibrating reed according to the above aspect of the present invention, it is possible to provide a piezoelectric vibrating reed which has a low disconnection possibility and ensures reliability for stable operation without requiring strict exposure position accuracy.

According to the piezoelectric vibrator, oscillator, electronic device, and radio-controlled clock according to the above aspect of the present invention, since they have the piezoelectric vibrating reed described above, it is possible to achieve improvement in reliability and high quality

DETAILED DESCRIPTION OF THE PREFERRED EMBODIMENTS

Piezoelectric Vibrating Reed

Hereinafter, a piezoelectric vibrating reed according to an embodiment of the present invention will be described with reference to FIGS. 1 to 15.

Figure 1:
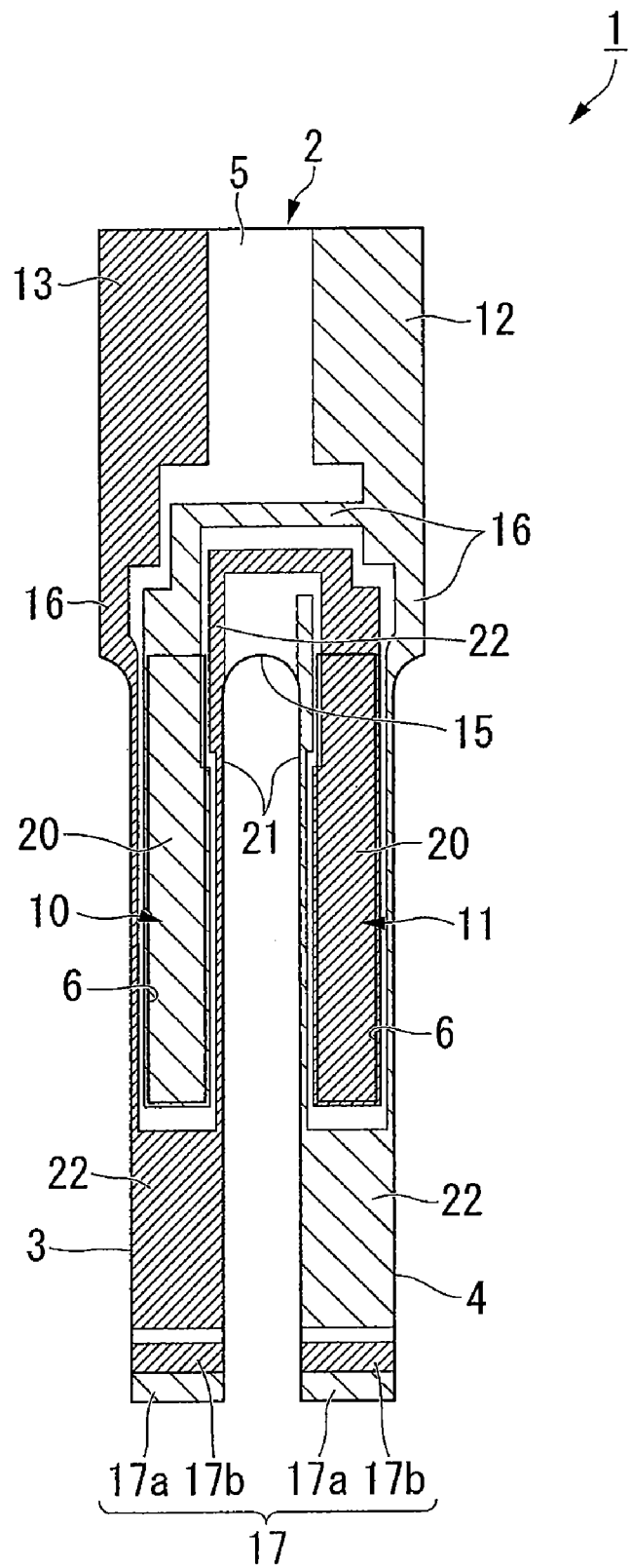
FIG. 1 is a top view showing a piezoelectric vibrating reed according to an embodiment of the present invention.
Figure 2:
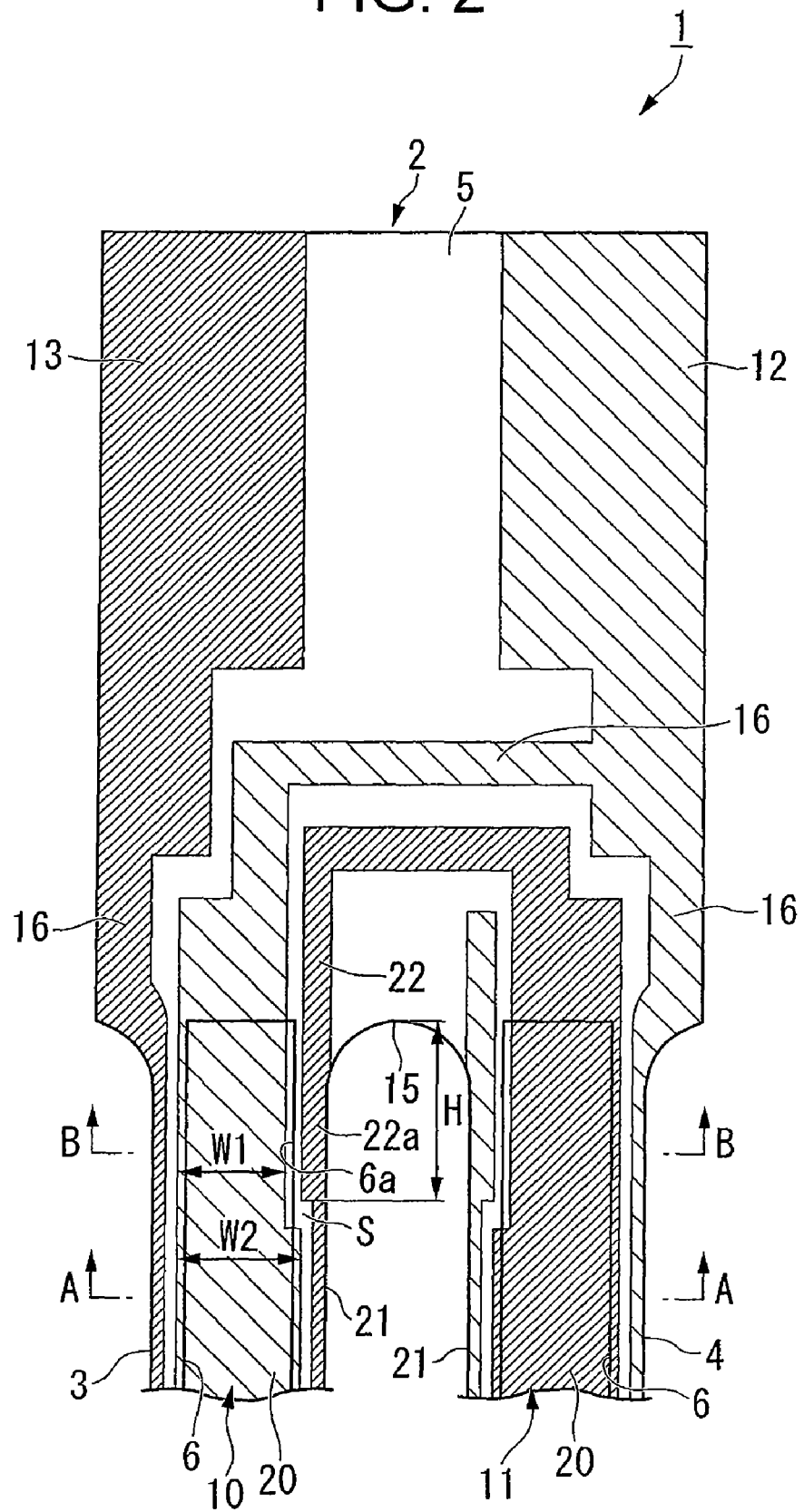
FIG. 2 is an enlarged view of the piezoelectric vibrating reed shown in FIG. 1, showing a base end of a vibrating arm in an enlarged scale.

A piezoelectric vibrating reed 1 according to the present embodiment is incorporated, for example, into a glass-packaged or cylinder-packaged piezoelectric vibrator of the surface-mounting type. As shown in FIGS. 1 and 2, the piezoelectric vibrating reed 1 includes a turning-fork type piezoelectric plate 2 made of a piezoelectric material such as quartz, lithium tantalate, or lithium niobate.

FIG. 1 is a top view of the piezoelectric vibrating reed 1. FIG. 2 is an enlarged view of base ends of vibrating arms 3 and 4 shown in FIG. 1.

The piezoelectric plate 2 includes a pair of vibrating arms 3 and 4 disposed in parallel to each other and a base portion 5 to which the base ends of the pair of vibrating arms 3 and 4 are integrally fixed. Moreover, on the principal surfaces (top and back surfaces) of the pair of vibrating arms 3 and 4, groove portions 6 are formed so as to extend in a vertical direction with a constant width from the base ends of the vibrating arms 3 and 4 towards the tip ends thereof. The groove portions 6 extend from the base ends of the vibrating arms 3 and 4 to positions over the middle portions thereof. With this configuration, the pair of vibrating arms 3 and 4 each have an H-type section as shown in FIGS. 3 and 4.

Figure 3:
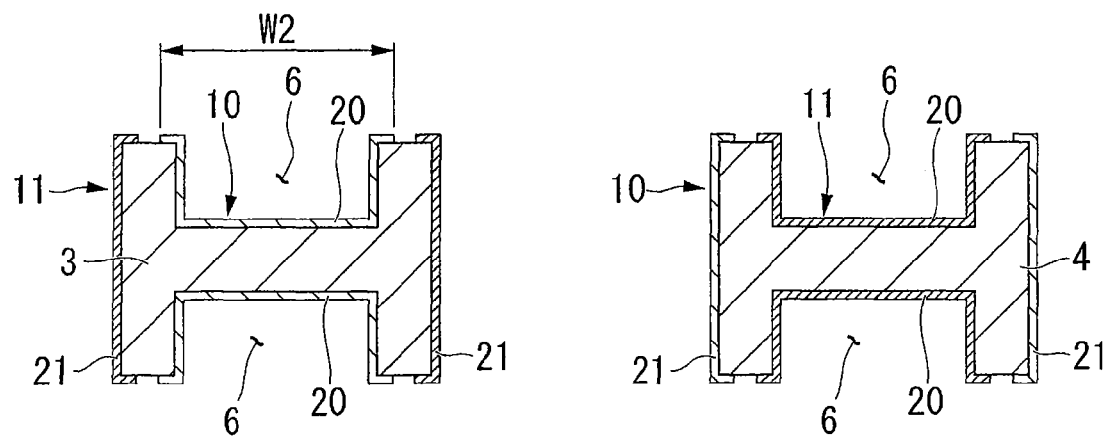
FIG. 3 is a sectional view of the piezoelectric vibrating reed taken along the line A-A in FIG. 2.
Figure 4:
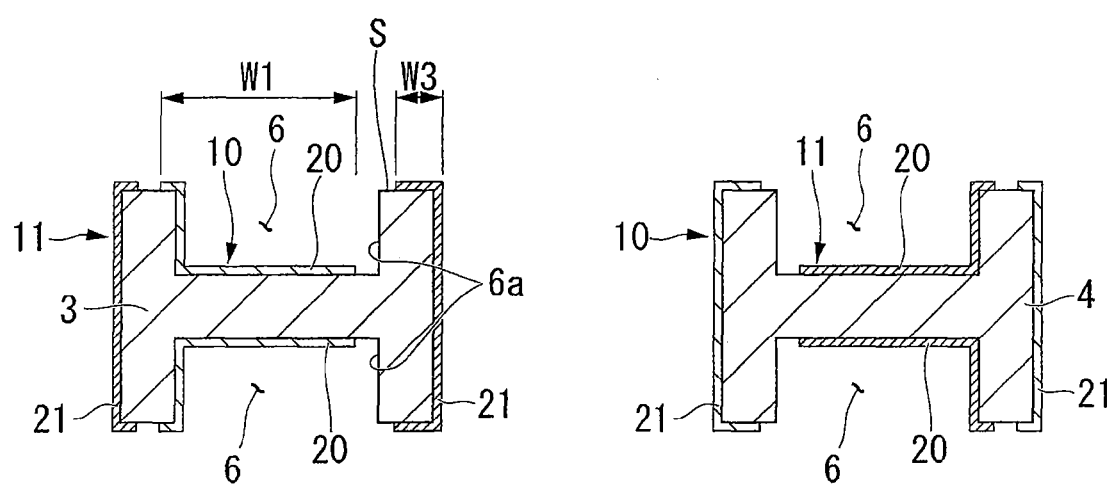
FIG. 4 is a sectional view of the piezoelectric vibrating reed taken along the line B-B in FIG. 2.

FIG. 3 is a sectional view taken along the line A-A in FIG. 2. FIG. 4 is a sectional view taken along the line B-B in FIG. 2.

On the outer surfaces of the piezoelectric plate 2 formed thus, a pair of excitation electrodes 10 and 11 and a pair of mount electrodes 12 and 13 are formed, as shown in FIGS. 1 and 2. Among these electrodes, the pair of excitation electrodes 10 and 11 are electrodes that allow the pair of vibrating arms 3 and 4 to vibrate at a predetermined resonance frequency in a direction to move closer to or away from each other upon application of a voltage. The excitation electrodes 10 and 11 are mainly formed on the outer surfaces of the pair of vibrating arms 3 and 4 in an electrically isolated state.

Specifically, as shown in FIG. 3, one excitation electrode 10 is mainly formed in the groove portion 6 of one vibrating arm 3 and on the side surfaces of the other vibrating arm 4. On the other hand, the other excitation electrode 11 mainly formed on the side surfaces of one vibrating arm 3 and in the groove portion 6 of the other vibrating arm 4.

Here, the excitation electrodes 10 and 11 will be described in more detail.

Figure 5:
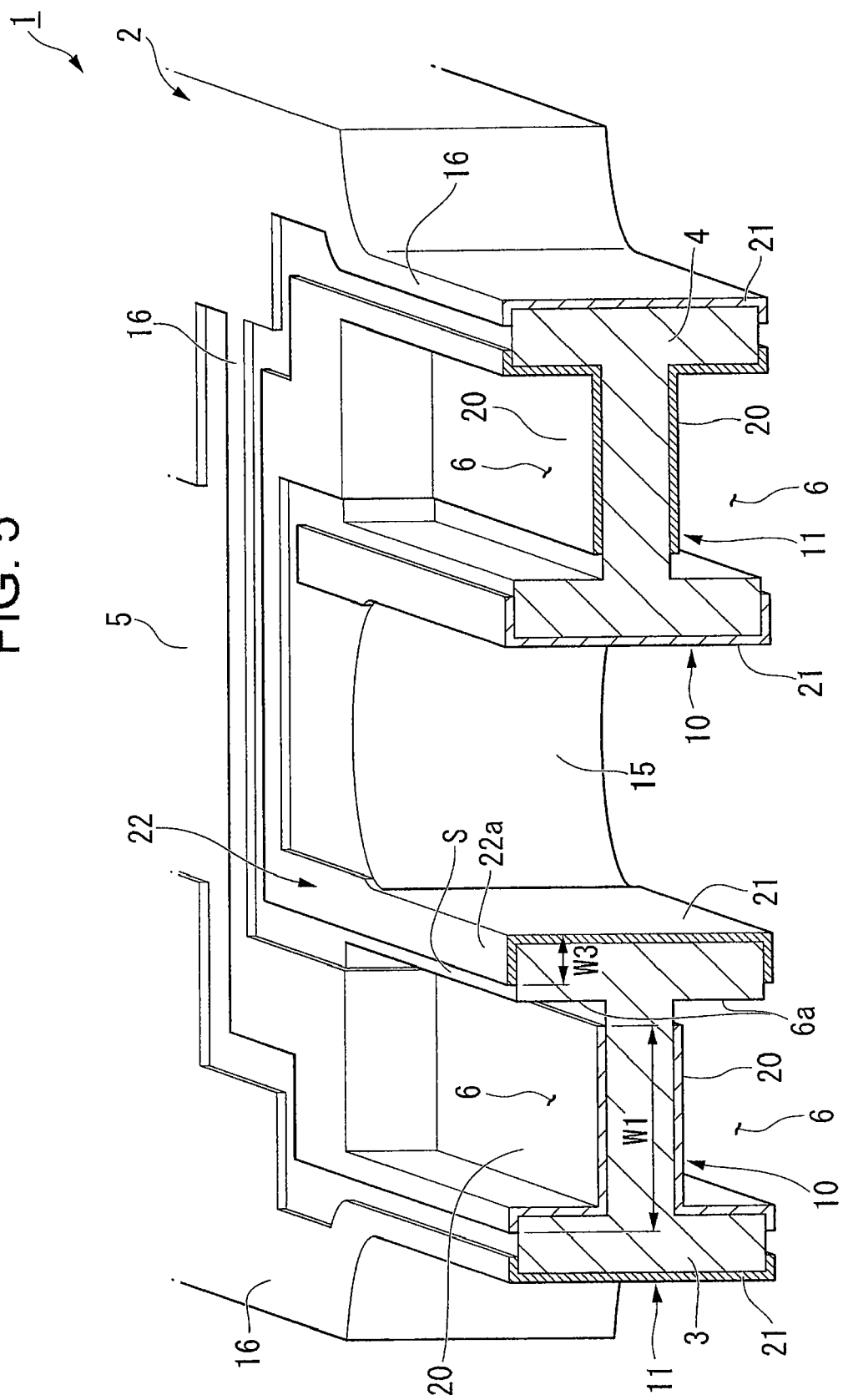
FIG. 5 is an enlarged perspective view (partly sectional view) of the vicinity of a fork portion of the piezoelectric vibrating reed shown in FIG. 1 and is also a sectional view of the piezoelectric vibrating reed taken along the line B-B.

As shown in FIGS. 1 to 5, the excitation electrodes 10 and 11 of the present embodiment each include principal electrode portions 20, side electrode portions 21, and a connection electrode portion 22. FIG. 5 is an enlarged perspective view (partly sectional view) of the vicinity of a fork portion 15 of the piezoelectric vibrating reed 1 shown in FIG. 1.

The principal electrode portions 20 are electrodes which are formed in the groove portions 6 and on portions of the principal surfaces of the vibrating arms 3 and 4 surrounding the groove portions 6. In this case, as shown in FIGS. 2 to 5, the principal electrode portions 20 are formed such that in a top view thereof, a horizontal width W1 on the base end sides of the vibrating arms 3 and 4 (the length in the lateral direction of each of the vibrating arms 3 and 4) is smaller than a horizontal width W2 in other portions. That is to say, the principal electrode portions 20 do not have a uniform horizontal width along the longitudinal direction of the vibrating arms 3 and 4 but have the small horizontal width W1 on the base end side of the vibrating arms 3 and 4. With this configuration, vacant areas S where the principal electrode portions 20 are not formed are secured on portions of the principal surfaces of the vibrating arm 3 in the vicinity of the fork portion 15.

In the present embodiment, the principal electrode portions 20 are formed with a small width to the extent that electrodes are not formed on sidewalls 6a of the groove portions 6 in the vicinity of the fork portion 15. However, the present invention is not limited to this example, but the principal electrode portions 20 may be formed with a small width to the extent that electrodes are formed on the sidewalls 6a of the groove portions 6 in the vicinity of the fork portion 15.

The side electrode portions 21 are electrodes which are formed on the sides of the vibrating arms 3 and 4. In this case, as shown in FIG. 1, the side electrode portion 21 formed on the inner side surfaces (close to the fork portion 15) of the vibrating arms 3 and 4 and the side electrode portion 21 formed on the outer side surfaces of the vibrating arms 3 and 4 are electrically connected by the connection electrode portion 22 which is formed at a position closer to the tip ends than the groove portions 6.

As shown in FIGS. 2 to 5, the connection electrode portion 22 is an electrode which is formed on the principal surfaces of the vibrating arms 3 and 4 to be connected to the side electrode portions 21. The connection electrode portion 22 is connected to the principal electrode portions 20 disposed on the vibrating arm 4 after being led out towards the other vibrating arm 4 on the top surface side via the principal surface of the base portion 5.

By this connection electrode portion 22, the principal electrode portion 20 disposed on one vibrating arm 3 and the side electrode portion 21 disposed on the other vibrating arm 4 can be connected together on the top surface side. Moreover, the side electrode portion 21 disposed on one vibrating arm 3 and the principal electrode portion 20 disposed on the other vibrating arm 4 can be connected together on the back surface side.

Although FIGS. 1, 2, and 5 show the top surface side of the piezoelectric vibrating reed 1, the electrode pattern on the back surface side is horizontally symmetrical to the electrode pattern on the top surface side.

Meanwhile, as shown in FIGS. 2, 3, and 5, the connection electrode portion 22 has a large-width portion 22a which has a large width and is formed on the principal surface of the vibrating arm 3 so as to come close to an opening end side of the groove portion 6 by occupying the vacant area S that is previously provided by the electrode pattern of the principal electrode portion 20.

In the present embodiment, the large-width portion 22a is formed so as to extend from the base end of the vibrating arm 3, namely the fork portion 15, towards the tip end and to have a large width within a range H of 100 μm and 200 μm. Moreover, the large-width portion 22a is formed to have a horizontal width W3 of 10 μm.

Moreover, as shown in FIG. 2, the pair of mount electrodes 12 and 13 are formed on the outer surface including the principal surface and the side surfaces of the base portion 5 and are electrically connected to the pair of excitation electrodes 10 and 11, respectively, via an extraction electrode 16. Therefore, a voltage is applied to the pair of excitation electrodes 10 and 11 via the mount electrodes 12 and 13.

The above-mentioned excitation electrodes 10 and 11, mount electrodes 12 and 13, and extraction electrode 16 are made of a laminated film of chromium (Cr) and gold (Au), for example, which is formed by depositing a chromium film having good adhesion to quartz as a base film and depositing a thin film of gold on the surface of the base film. However, it should be noted that the present invention is not limited to this example, but, for example, a thin film of gold may be laminated further on the surface of a laminated film of chromium and nichrome (NiCr). Moreover, the above-mentioned electrodes may be made of a single-layer film of chromium, nickel, aluminum (Al), or titanium (Ti).

Furthermore, as shown in FIG. 1, weight metal films 17 (including a rough tuning film 17a and a fine tuning film 17b) for adjusting the vibration states (specifically, tuning the frequency) of the vibrating arms 3 and 4 to vibrate within a predetermined frequency range are formed on the tip ends of the vibrating arms 3 and 4. By tuning the frequency with the use of the weight metal films 17, the frequency of the pair of the vibrating arms 3 and 4 can be set to fall within the range of the nominal frequency of the device.

When the piezoelectric vibrating reed 1 configured in this manner is operated, a predetermined drive voltage is applied between the pair of excitation electrodes 10 and 11. In this way, a current can be made to flow to the excitation electrodes 10 and 11, and the pair of vibrating arms 3 and 4 are allowed to vibrate at a predetermined frequency in a direction to move closer to or away from each other. This vibration can be used as the time source, the timing source of a control signal, the reference signal source, and the like.

Figure 6:
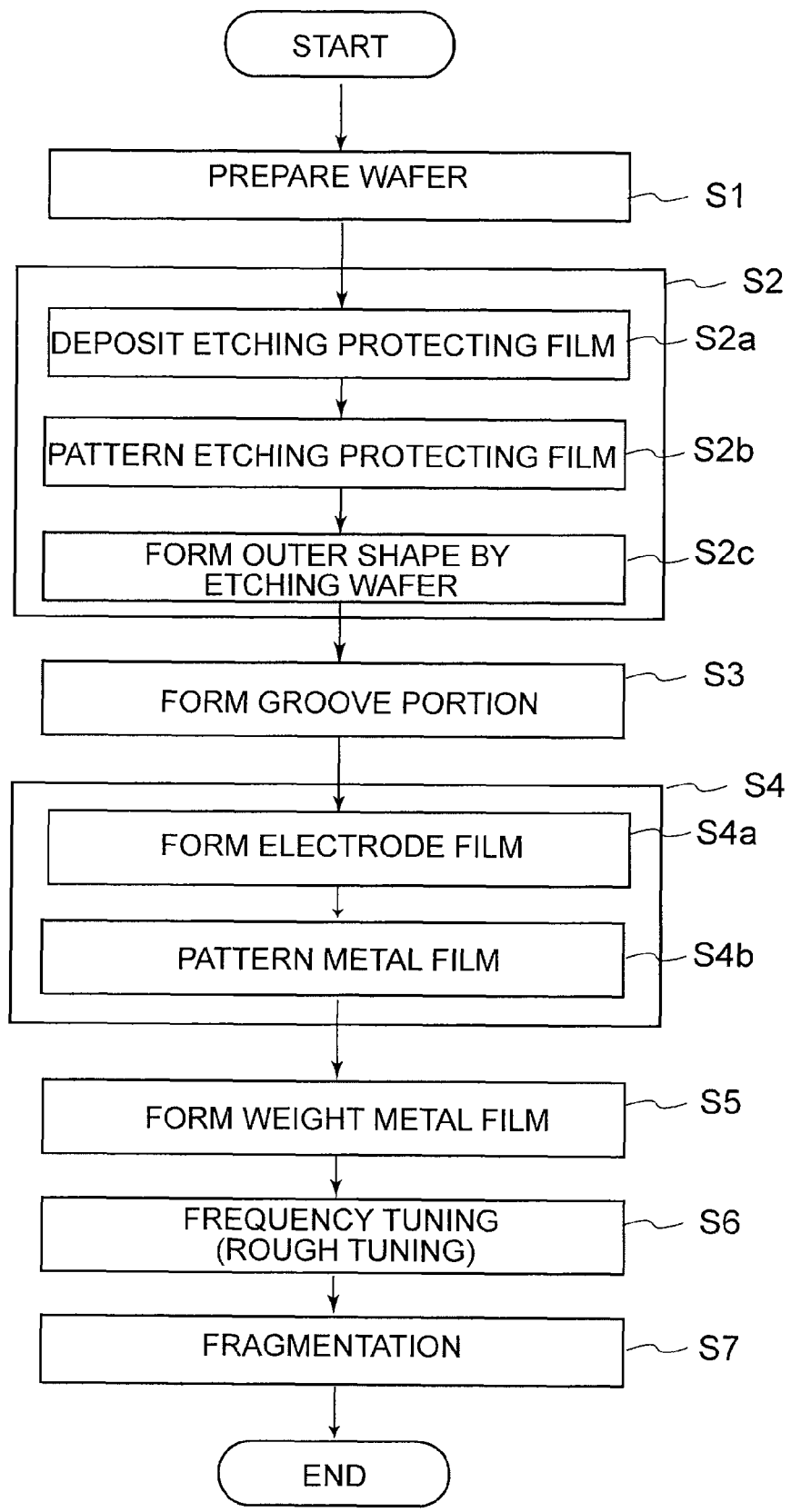
FIG. 6 is a flowchart of the manufacturing method of the piezoelectric vibrating reed shown in FIG. 1.

Next, a method for manufacturing a plurality of the above-described piezoelectric vibrating reeds 1 at a time using a wafer made of a piezoelectric material will be described with reference to the flowchart shown in FIG. 6.

First, a wafer S having been subjected to polishing and finished highly accurately to a predetermined thickness is prepared (S1). Subsequently, an outer shape forming step is performed where the wafer S is etched by a photolithography technique to form the outer shape of a plurality of piezoelectric plates 2 on the wafer S (S2). This step will be described in detail below.

Figure 7:
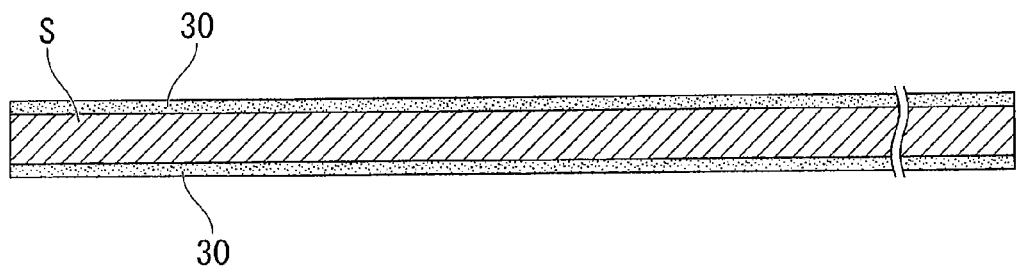
FIG. 7 is a view showing one step of the manufacturing method of the piezoelectric vibrating reed shown in FIG. 1, showing a state where an etching protection film is formed on both surfaces of a wafer.

Initially, as shown in FIG. 7, an etching protection film 30 is deposited on the both surfaces of the wafer S (S2a). As the etching protection film 30, for example, a film of chromium (Cr) having a thickness of about several μm is deposited. Subsequently, a photoresist film (not shown) is patterned on the etching protection film 30 by a photolithographic technique. At this time, the photoresist film is patterned so as to surround the periphery of each piezoelectric plate 2 formed of a pair of vibrating arms 3 and 4 and a base portion 5. Moreover, etching is performed using the photoresist film as a mask, so that unmasked regions of the etching protection film 30 are selectively removed. The photoresist film is removed after the etching.

Figure 8:
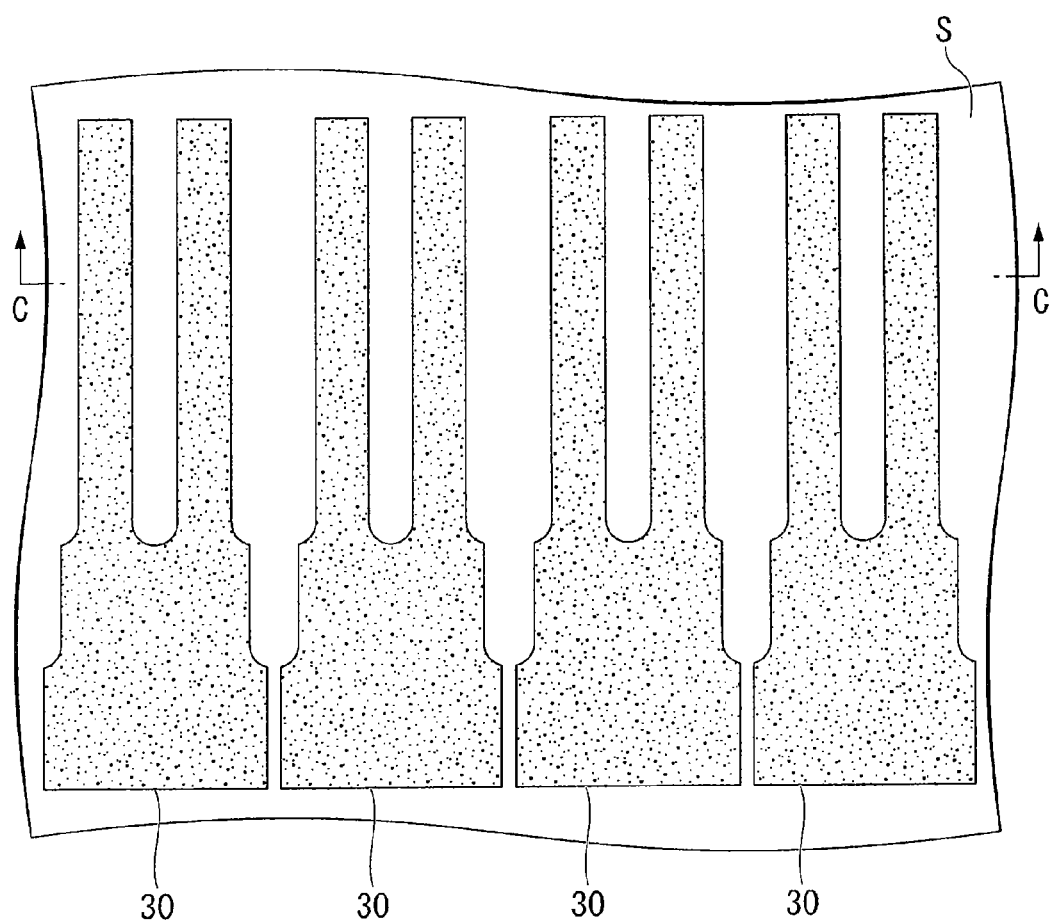
FIG. 8 is a view showing a state where the etching protection film is patterned into the outer shape of the piezoelectric plate of the piezoelectric vibrating reed, obtained from the state shown in FIG. 7.
Figure 9:
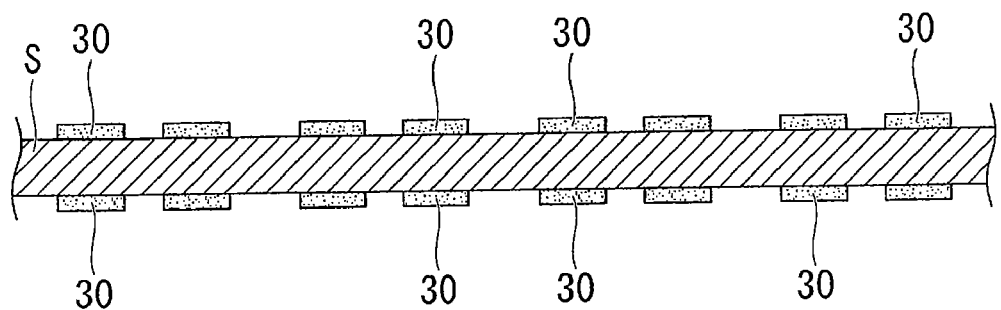
FIG. 9 is a sectional view taken along the line C-C in FIG. 8.

In this way, as shown in FIGS. 8 and 9, the etching protection film 30 is patterned to comply with the outer shape of the piezoelectric plate 2, namely the outer shapes of the pair of vibrating arms 3 and 4 and the base portion 5 (S2b). At this time, patterning is performed by the number of plural piezoelectric plates 2. FIGS. 9 to 12 are sectional views taken along the line C-C in FIG. 8.

Figure 10:
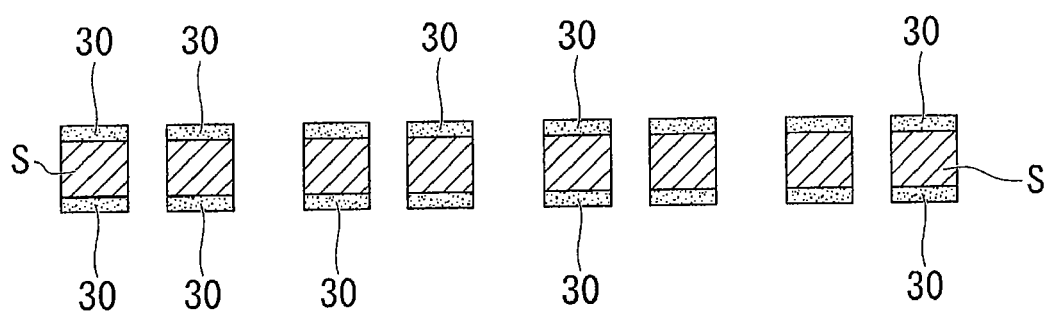
FIG. 10 is a view showing a state where the wafer is etched using the etching protection film as a mask, obtained from the state shown in FIG. 9.

Subsequently, both surfaces of the wafer S are etched using the patterned etching protection film 30 as a mask (S2c). In this way, as shown in FIG. 10, the regions of the piezoelectric plate 10, which are not masked by the etching protection film 30, are selectively removed, and the outer shape of the piezoelectric plate 2 can be formed. The outer shape forming step ends at this point in this time.

Figure 11:
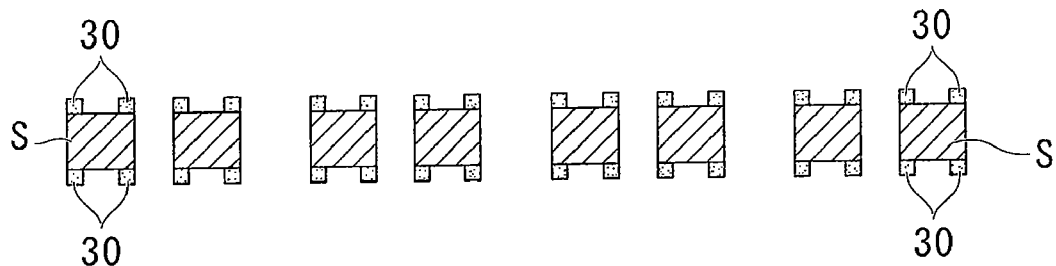
FIG. 11 is a view showing a state where the etching protection film is patterned further, obtained from the state shown in FIG. 10.

Subsequently, a groove forming step is performed where groove portions 6 are formed on the principal surfaces of the pair of vibrating arms 3 and 4 (S3). Specifically, similar to the case of the outer shape forming step described above, a photoresist film is formed on the etching protection film 30. The photoresist film is patterned so as to clear the regions of the groove portions 6 by a photolithography technique. Moreover, etching is performed using the patterned photoresist film as a mask, so that the etching protection film 30 is selectively removed. Thereafter, the photoresist film is removed after the etching, whereby as shown in FIG. 11, the etching protection film 30 which has been patterned in advance can be patterned further in a state where the regions of the groove portions 6 are cleared.

Figure 12:
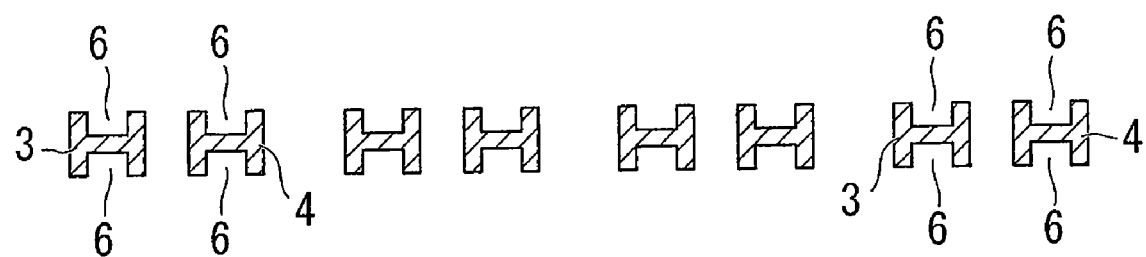
FIG. 12 is a view showing a state where the wafer is etched using the patterned etching protection film as a mask, obtained from the state shown in FIG. 11.

Subsequently, the wafer S is etched using the etching protection film 30 having been patterned again as a mask, and then, the etching protection film 30 used as the mask is removed. In this way, as shown in FIG. 12, the groove portions 6 can be formed on both principal surfaces of the pair of vibrating arms 3 and 4.

The plurality of piezoelectric plates 2 remain in a state where they are connected to the wafer S via connection portions not shown until a cutting step which is performed later is performed.

Subsequently, an electrode forming step is performed where an electrode film is patterned on the outer surface of the plurality of piezoelectric plates 2 by performing exposure through a mask not shown, thus forming excitation electrodes 10 and 11, an extraction electrode 16, and mount electrodes 12 and 13 (S4). This step will be described in detail below.

Figure 13:
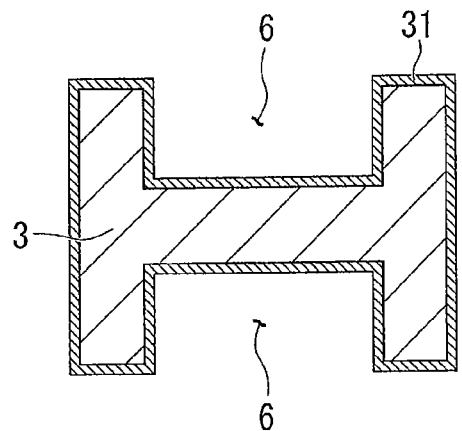
FIG. 13 is a view showing a state where an electrode film is formed, obtained from the state shown in FIG. 12.
Figure 14:
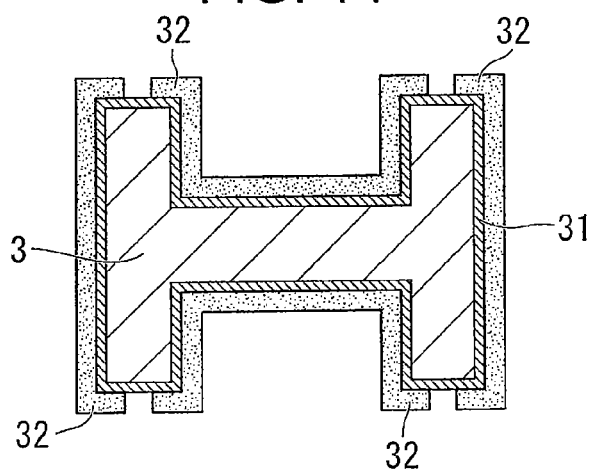
FIG. 14 is a view showing a state where a photoresist film is formed on the electrode film and the photoresist film is patterned, obtained from the state shown in FIG. 13.
Figure 15:
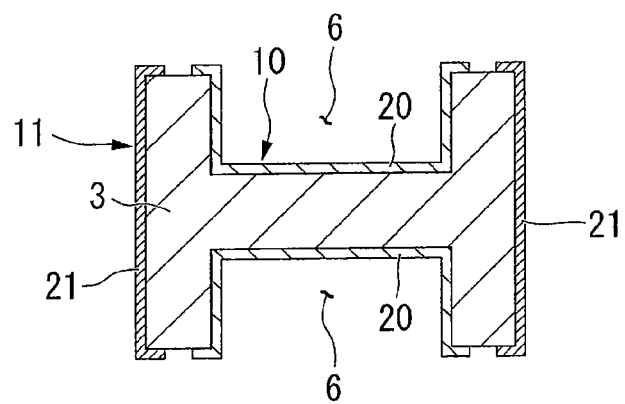
FIG. 15 is a view showing a state where the electrode film is etched using the patterned photoresist film as a mask, obtained from the state shown in FIG. 14.

First, as shown in FIG. 13, by deposition, sputtering, or the like, an electrode film 31 is formed on the outer surface of the piezoelectric plate 2 having the groove portions 6 formed thereon (S4a). FIGS. 13 to 15 show only one vibrating arm 3.

Subsequently, as shown in FIG. 14, a photoresist film 32 is formed by spray coating or the like, and the photoresist film 32 is patterned by performing exposure through a mask not shown. At this time, the patterning is performed such that desired portions of the electrode film 31 are coated with the photoresist film 32. Moreover, the electrode film 31 is etched and patterned using the remaining photoresist film 32 as a mask (S4b). Thereafter, when the photoresist film 32 used as the mask is removed, electrodes as shown in FIG. 15 can be formed. In this way, the electrode forming step ends.

Subsequently, after the electrode forming step is completed, a weight metal film 17 (for example, silver or gold) including a rough tuning film 17a and a fine tuning film 17b for frequency tuning is formed at the tip end of the pair of vibrating arms 3 and 4 (S5). A rough tuning step is then performed where the resonance frequency of all the vibrating arms 3 and 4 formed on the wafer is adjusted roughly (S6). This is achieved by irradiating the rough tuning film 17a of the weight metal film 17 with laser light to partly evaporate the rough tuning film 17a, thus changing a weight thereof. Fine tuning of adjusting the resonance frequency more accurately is performed at the time of manufacturing the piezoelectric vibrator.

As a final step, a cutting step is performed where the connection portions connecting the wafer S and the piezoelectric plates 2 are cut so that the plurality of piezoelectric plates 2 are separated from the wafer S to obtain small fragments (S7). In this way, a plurality of turning-fork type piezoelectric vibrating reeds 1 can be manufactured from one wafer S at a time. The manufacturing step of the piezoelectric vibrating reed 1 ends at this point in time, and the piezoelectric vibrating reed 1 shown in FIG. 1 can be obtained.

Meanwhile, since the respective electrodes are patterned by exposure in the above-described electrode forming step, exposure position accuracy is crucial. Particularly, the exposure position accuracy is crucial for the excitation electrodes 10 and 11 having the principal electrode portions 20, side electrode portions 21, and connection electrode portion 22 since they require fine patterning.

However, in the present embodiment, the principal electrode portions 20 are formed to have the small horizontal width W1 in the vicinity of the fork portion 15, thus securing the vacant area S on the principal surface of the vibrating arm 3 in the vicinity of the fork portion 15. Moreover, the connection electrode portion 22 is formed so as to occupy the vacant area S to have the large-width portion 22a having the great horizontal width W3 in the vicinity of the fork portion 15.

Therefore, even when the formation position of the connection electrode portion 22 is slightly shifted towards the fork portion 15 in the lateral direction of the vibrating arm 3 at the time of exposure, the connection electrode portion 22 can be formed securely on the principal surface of the vibrating arm 3 in the vicinity of the fork portion 15. That is to say, even when positioning is not achieved with such strict exposure position accuracy as in the related art, the connection electrode portion 22 can be formed on the peripheral surface of the vibrating arm 3 in the vicinity of the fork portion 15. For this reason, it is possible to achieve a reliable connection between the connection electrode portion 22 and the side electrode portions 21. Therefore, it is possible to reduce the disconnection possibility and ensure reliability for stable operation of the vibrating reed.

Moreover, since the disconnection possibility can be reduced without requiring such strict exposure position accuracy, it is possible to improve manufacturing efficiency and achieve cost-reduction.

Furthermore, in the present embodiment, the large-width portion 22a of the connection electrode portion 22 is formed on the principal surface of the vibrating arm 3 over a range of at least 100 µm from the fork portion 15 to the tip end of the vibrating arm 3. For this reason, even when the formation position of the connection electrode portion 22 is slightly shifted towards the fork portion 15 in the lateral direction of the vibrating arms 3 and 4, it is possible to connect the connection electrode portion 22 and the side electrode portions 21 together over a sufficient length and to thus reduce the disconnection possibility further.

Moreover, since the length of the large-width portion 22a of the connection electrode portion 22 is 200 µm or less, it is possible to decrease the length of the principal electrode portion 20 having a small width as much as possible. Particularly, since the greater the horizontal width of the principal electrode portion 20, the better the R1 value can be reduced, by decreasing the length of the small-width portion as much as possible, it becomes easy to suppress the R1 value to a low value and to improve the vibration characteristics.

Furthermore, in the present embodiment, the large-width portion 22a having the horizontal width W3 of 10 µm is secured for the connection electrode portion 22. When electrodes are formed by exposure using a mask, the exposure position accuracy is typically set to approximately ±4 to 5 µm. Therefore, even when the formation position of the connection electrode portion 22 is shifted by a distance 5 µm towards the fork portion 15 in the lateral direction of the vibrating arms 3 and 4 at the time of exposure, the connection electrode portion 22 can be securely formed on the principal surface of the vibrating arm 3 in the vicinity of the fork portion 15. Therefore, the disconnection possibility can be reduced further.

Glass-Packaged Piezoelectric Vibrator

Next, a piezoelectric vibrator according to an embodiment of the present invention will be described with reference to FIGS. 16 to 19. The present embodiment will be described by way of an example of a glass-packaged piezoelectric vibrator of the surface-mounting type as an example of the piezoelectric vibrator.

As shown in FIGS. 16 to 19, a piezoelectric vibrator 40 of the present embodiment is a piezoelectric vibrator 40 which is formed in the form of a box laminated in two layers of a base board 41 and a lid board 42 and in which the above-described turning-fork type piezoelectric vibrating reed 1 is accommodated in a cavity C at an inner portion thereof.

Figure 16:
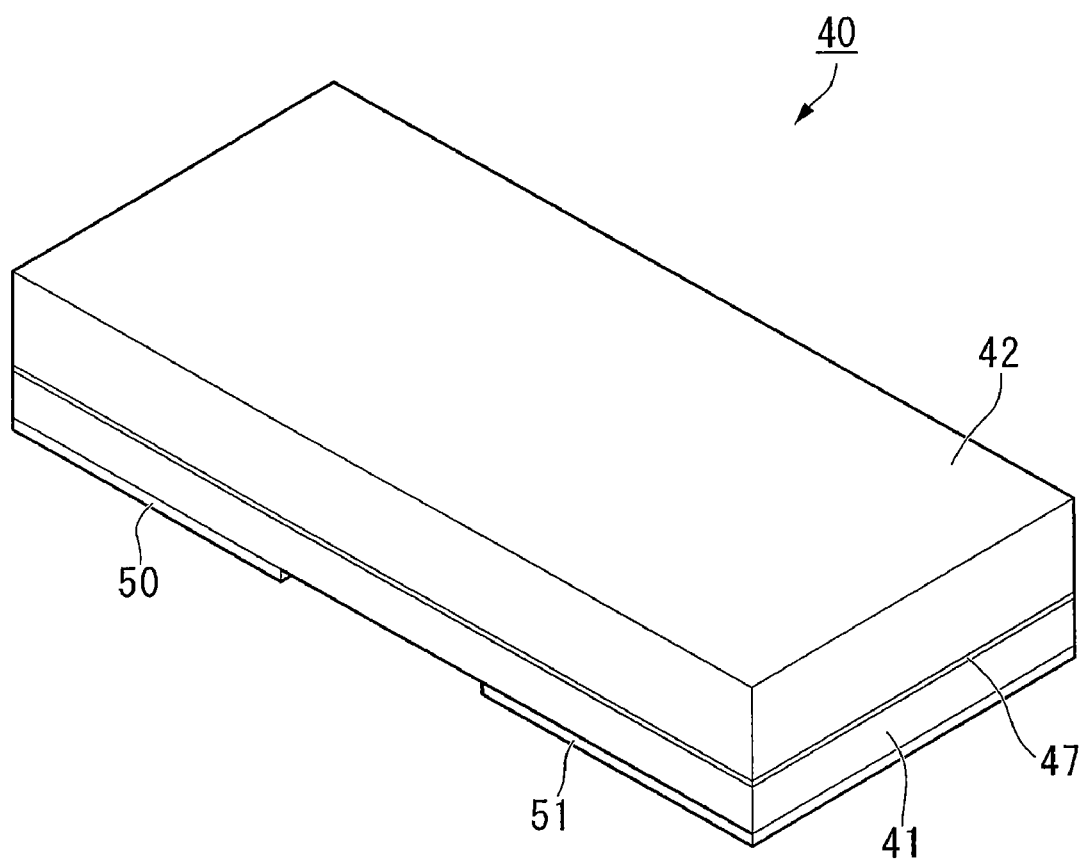
FIG. 16 is a perspective view showing an external appearance of a piezoelectric vibrator according to an embodiment of the present invention.
Figure 17:
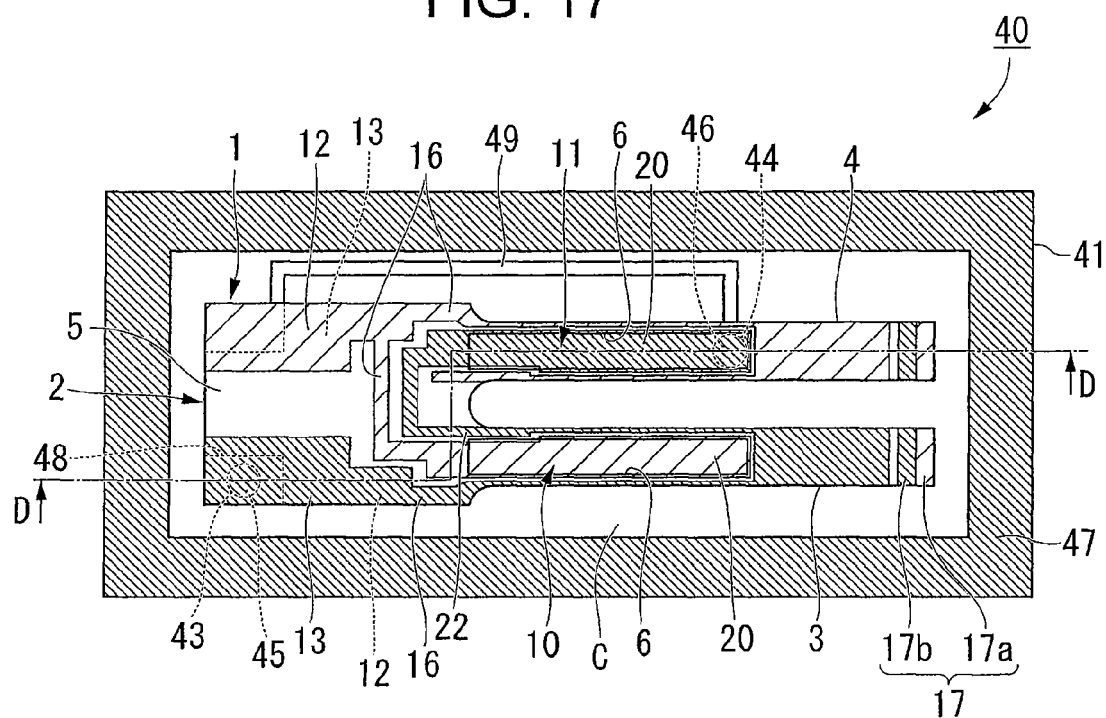
FIG. 17 is a top view showing an internal structure of the piezoelectric vibrator shown in FIG. 16 when a piezoelectric vibrating reed is viewed from above with a lid board removed.
Figure 18:
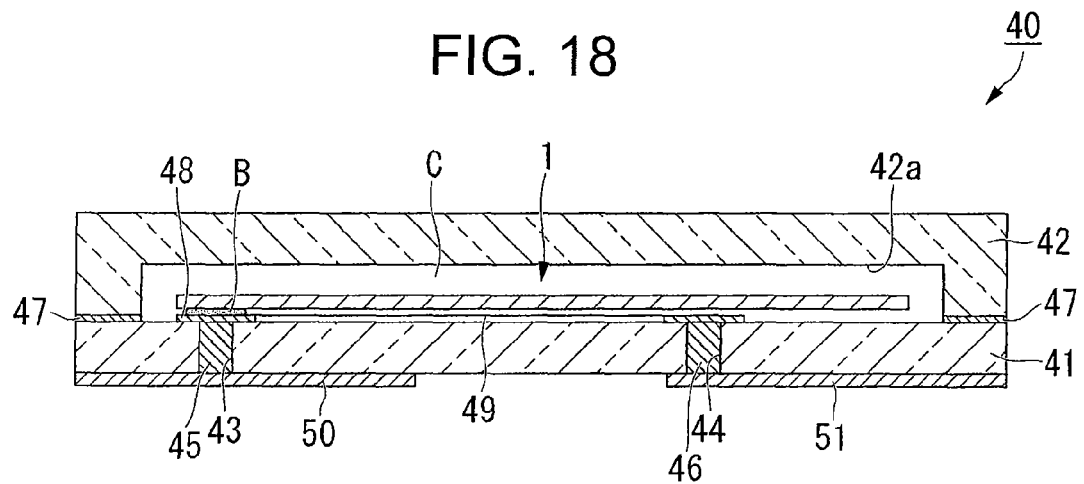
FIG. 18 is a sectional view of the piezoelectric vibrator taken along the line D-D in FIG. 17.
Figure 19:
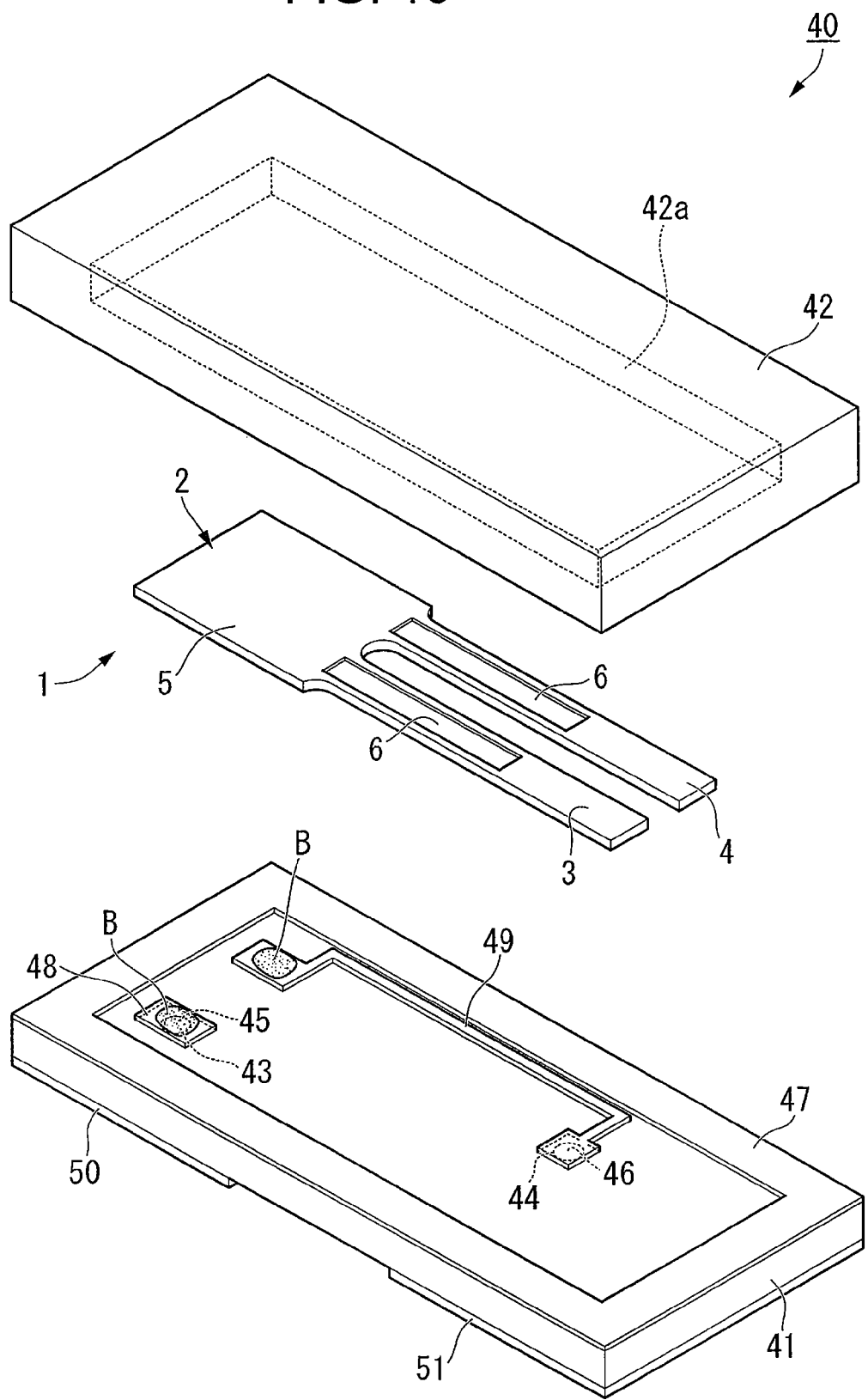
FIG. 19 is an exploded perspective view of the piezoelectric vibrator shown in FIG. 16.

FIG. 16 is a perspective view showing an external appearance of the piezoelectric vibrator 40. FIG. 17 is a top view showing an internal structure of the piezoelectric vibrator 40 shown in FIG. 16, showing a state where the lid board 42 is removed. FIG. 18 is a sectional view of the piezoelectric vibrator 40 taken along the line D-D in FIG. 17. FIG. 19 is an exploded perspective view of the piezoelectric vibrator 40. In FIG. 19, the respective electrodes of the piezoelectric vibrating reed 1 are not shown.

The piezoelectric vibrating reed 1 is mounted on an upper surface of the base board 41 by bump bonding using bumps B made of gold or the like. More specifically, bump bonding is achieved in a state where the pair of mount electrodes 12 and 13 come into contact with two bumps B formed on lead-out electrodes 48 and 49 described later, respectively, which are patterned on the upper surface of the base board 41. In this way, the piezoelectric vibrating reed 1 is supported in a state of being floated from the upper surface of the base board 41, and the mount electrodes 12 and 13 and the lead-out electrodes 48 and 49 are electrically connected to each other.

The lid board 42 is a transparent insulating board made of a glass material, for example, soda-lime glass, and is formed in a board-like form as shown in FIGS. 16, 18, and 19. A bonding surface side thereof to be bonded with the base board 41 is formed with a rectangular recess portion 42a in which the piezoelectric vibrating reed 1 is accommodated. The recess portion 42a is a recess portion for a cavity serving as the cavity C that accommodates the piezoelectric vibrating reed 1 when the two boards 41 and 42 are overlapped with each other. The lid board 42 is anodically bonded to the base board 41 in a state where the recess portion 42a faces the base board 41.

The base board 41 is a transparent insulating board made of glass material, for example, soda-lime glass, similarly to the lid board 42, and is formed in a board-like form having a size capable of being overlapped with the lid board 42, as shown in FIGS. 16 to 19.

The base board 41 is formed with a pair of through-holes 43 and 44 penetrating through the base board 41. At this time, the pair of through-holes 43 and 44 are formed so as to be received in the cavity C. More specifically, one through-hole 43 is positioned close to the base portion 5 of the mounted piezoelectric vibrating reed 1, and the other through-hole 44 is positioned close to the tip ends of the vibrating arms 3 and 4.

Although the present embodiment is described by way of an example of the through-holes 43 and 44 which are configured to penetrate straight through the base board 41, the present invention is not limited to this example, but for example, the through-holes may be formed in a tapered form whose diameter gradually decreases towards the lower surface of the base board 41. In any case, they only need to penetrate through the base board 41.

The pair of through-holes 43 and 44 are formed with a pair of through-hole electrodes 45 and 46 which are formed so as to bury the through-holes 43 and 44. The through-hole electrodes 45 and 46 serve to maintain air-tightness of the inside of the cavity C by completely closing the through-holes 43 and 44 and achieve electrical connection between outer electrodes 50 and 51 described later and the lead-out electrodes 48 and 49.

The upper surface side of the base board 41 (the bonding surface side to be bonded to the lid board 42) is patterned with a bonding film 47 for anodic bonding and the pair of lead-out electrodes 48 and 49 by a conductive material (for example, aluminum). Among them, the bonding film 47 is formed along the peripheral edge of the base board 41 so as to surround the periphery of the recess portion 42a formed on the lid board 42.

Moreover, the pair of lead-out electrodes 48 and 49 are patterned so that one through-hole electrode 45 of the pair of through-hole electrodes 45 and 46 is electrically connected to one mount electrode 12 of the piezoelectric vibrating reed 1, and the other through-hole electrode 46 is electrically connected to the other mount electrode 13 of the piezoelectric vibrating reed 1.

More specifically, as shown in FIGS. 17 to 19, one lead-out electrode 48 is formed right above one through-hole electrode 45 to be disposed right below the base portion 5 of the piezoelectric vibrating reed 1. Moreover, the other lead-out electrode 49 is formed to be disposed right above the other through-hole electrode 46 after being led out from a position near one lead-out electrode 48 towards the tip end of the vibrating arm 4 along the vibrating arm 4.

The bumps B are formed on the pair of lead-out electrodes 48 and 49, and the piezoelectric vibrating reed 1 is mounted via the bumps B. In this way, one mount electrode 12 of the piezoelectric vibrating reed 1 is electrically connected to one through-hole electrode 45 via one lead-out electrode 48, and the other mount electrode 13 is electrically connected to the other through-hole electrode 46 via the other lead-out electrode 49.

Moreover, the lower surface of the base board 41 is formed with the outer electrodes 50 and 51 which are electrically connected to the pair of through-hole electrodes 45 and 46, respectively, as shown in FIGS. 16, 18, and 19. In this way, the pair of outer electrodes 50 and 51 are electrically connected to the pair of excitation electrodes 10 and 11 of the piezoelectric vibrating reed 1 via the pair of through-hole electrodes 45 and 46 and the pair of lead-out electrodes 48 and 49.

When the piezoelectric vibrator 40 configured in this manner is operated, a predetermined drive voltage is applied between the pair of outer electrodes 50 and 51. In this way, a current can be made to flow to the excitation electrodes 10 and 11 of the piezoelectric vibrating reed 1, and the pair of vibrating arms 3 and 4 are allowed to vibrate at a predetermined frequency in a direction to move closer to or away from each other. This vibration can be used as the time source, the timing source of a control signal, the reference signal source, and the like.

According to the piezoelectric vibrator 40 of the present embodiment, since the piezoelectric vibrator includes the piezoelectric vibrating reed 1 which has a low disconnection possibility and ensures reliability for stable operation, it is possible to obtain a high-quality piezoelectric vibrator having improved reliability.

Moreover, since the piezoelectric vibrator 40 is a glass-packaged piezoelectric vibrator of the surface-mounting type in which the piezoelectric vibrating reed 1 is hermetically sealed in the cavity C, it is possible to allow the piezoelectric vibrating reed 1 to vibrate without being affected by dust or the like and achieve high quality. In addition, since the piezoelectric vibrator 40 is a surface-mounting type piezoelectric vibrator, the piezoelectric vibrator can be mounted easily and has excellent stability after being mounted.

Cylinder-Packaged Piezoelectric Vibrator

Figure 20:
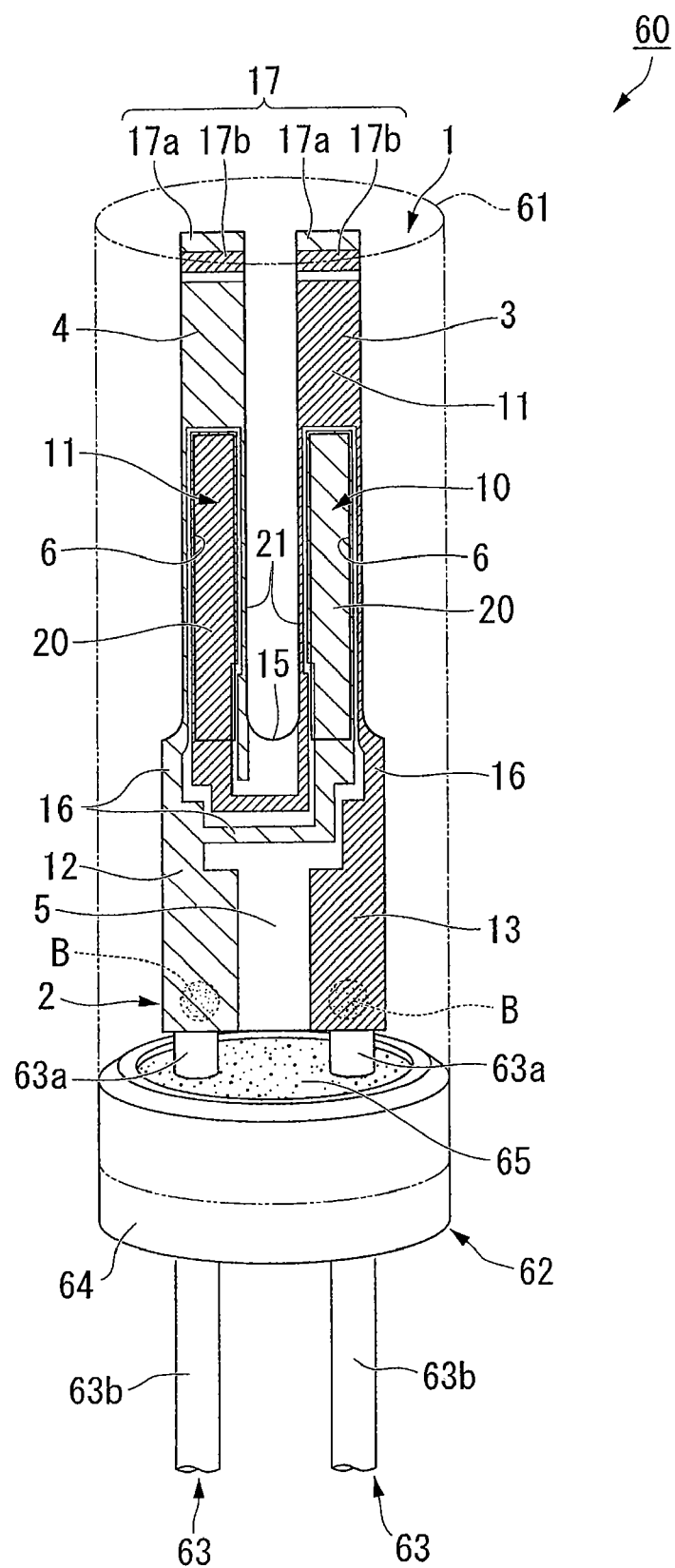
FIG. 20 is a top view of a cylinder package-type piezoelectric vibrator according to a modification of the present invention.

Next, a piezoelectric vibrator according to an embodiment of the present invention will be described with reference to FIG. 20. The present embodiment will be described by way of an example of a cylinder-packaged piezoelectric vibrator as an example of the piezoelectric vibrator.

A piezoelectric vibrator 60 of the present embodiment includes the piezoelectric vibrating reed 1, a case 61 that accommodates therein the piezoelectric vibrating reed 1, and an airtight terminal 62 that hermetically seals the piezoelectric vibrating reed 1 inside the case 61. FIG. 20 is a top view of the piezoelectric vibrator 60.

The piezoelectric vibrating reed 1 is mounted on inner leads 63a of lead terminals 63 constituting the airtight terminal 62 in a state of being accommodated in the case 61.

The case 61 is formed in the form of a bottomed cylinder and is press-fit to be fixedly fitted to an outer periphery of a stem 64, described later, of the airtight terminal 62. The case 61 is press-fitted in a vacuum and a space surrounding the piezoelectric vibrating reed 1 in the case 61 is in a state of being maintained in vacuum.

The airtight terminal 62 hermetically seals the inside of the case 61 and includes the stem 64 that is press-fit to be fixed to the inside of the case 61, two lead terminals 63 which are disposed in a state of penetrating through the stem 64 while interposing the stem 64 therebetween, in which one ends thereof serve as the inner leads 63a electrically connected to the pair of mount electrodes 12 and 13 of the piezoelectric vibrating reed 1, and the other ends thereof serve as outer leads 63b electrically connected to the outside, and a filling member 65 that fixes the lead terminals 63 and the stem 64.

The stem 64 is formed in a ring-like shape by a metal material (for example, low-carbon steel (Fe)), iron nickel alloy (Fe—Ni), iron nickel cobalt alloy (Fe—Ni—Co)). Moreover, the filling member 65 is made, for example, of borosilicate glass. It should be noted that an outer periphery of the stem 64 is coated with a plating (metal film) made of the same material as the lead terminals 63.

The lead terminals 63 are made, for example, of a conductive material which is the same material as the stem 64, in which portions thereof being projected to the inside of the case 61 serve as the inner leads 63a, and portions thereof being projected to the outside of the case 61 serve as the outer leads 63b. The piezoelectric vibrating reed 1 is mechanically mounted by conductive bumps B made of gold or the like in a state of being mounted on the tip ends of the inner leads 63a. That is to say, the inner leads 63a and the mount electrodes 12 and 13 are mechanically bonded and electrically connected by the bumps B. As a result, the piezoelectric vibrating reed 1 is brought into a state of being mounted on two lead terminals 63.

As a material of the plating of the stem 64 and the lead terminals 63, heat-resistant solder plating, tin copper alloy, gold tin alloy or the like is used. Moreover, by cold-welding the stem 64 to the case 61 in vacuum with the plating on the outer periphery of the stem 64 interposed therebetween, the inside of the case 61 can be hermetically sealed in a vacuum state.

According to the piezoelectric vibrator 60 configured in this manner, since the piezoelectric vibrator includes the piezoelectric vibrating reed 1 which has a low disconnection possibility and ensures reliability for stable operation, it is possible to obtain a high-quality piezoelectric vibrator having improved reliability.

Moreover, since the piezoelectric vibrator 60 is a cylinder-packaged piezoelectric vibrator in which the piezoelectric vibrating reed 1 is hermetically sealed in the case 61, it is possible to allow the piezoelectric vibrating reed 1 to vibrate without being affected by dust or the like and achieve high quality.

Oscillator

Next, an oscillator according to an embodiment of the present invention will be described with reference FIG. 21.

Figure 21:
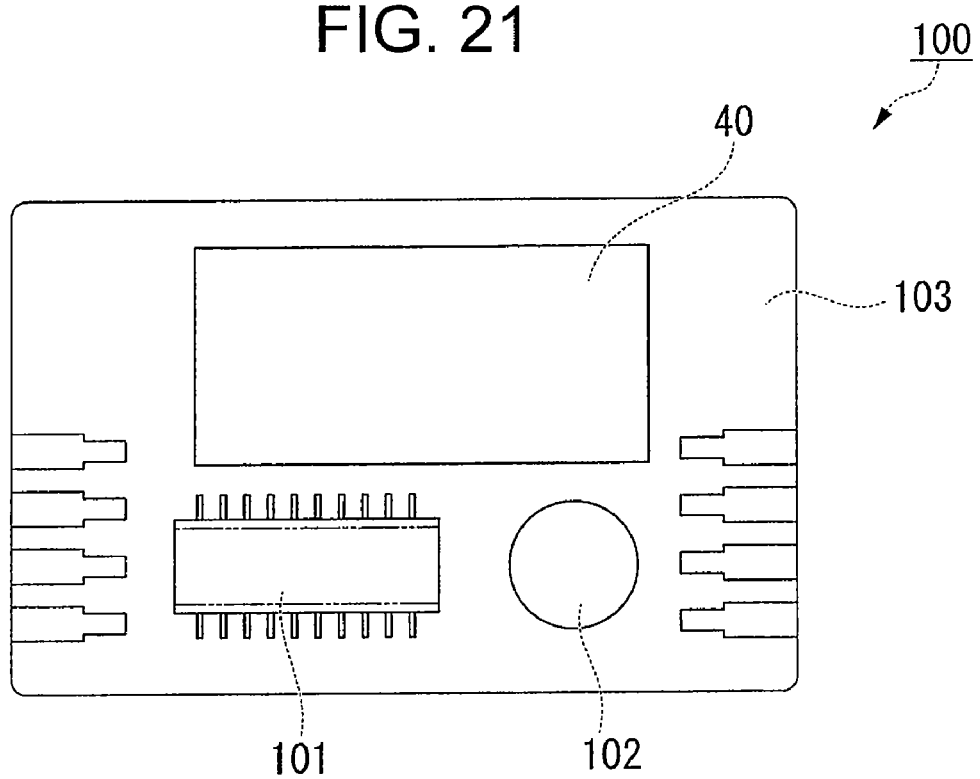
FIG. 21 is a view showing the configuration of an oscillator according to an embodiment of the present invention.

As shown in FIG. 21, an oscillator 100 of the present embodiment is one in which the piezoelectric vibrator 40 is configured as an oscillating piece that is electrically connected to an integrated circuit 101. It should be noted that the piezoelectric vibrator 60 may be incorporated into the oscillator.

The oscillator 100 includes a board 103 on which an electronic component 102 such as a capacitor is mounted. The integrated circuit 101 for the oscillator is mounted on the board 103, and the piezoelectric vibrating reed 1 of the piezoelectric vibrator 40 is mounted in the vicinity of the integrated circuit 101.

These electronic component 102, integrated circuit 101, and piezoelectric vibrator 40 are electrically connected by a wiring pattern which is not shown. It should be noted that these components are molded by resin which is not shown.

In the oscillator 100 configured in this manner, the piezoelectric vibrating reed 1 in the piezoelectric vibrator 40 vibrates when a voltage is applied to the piezoelectric vibrator 40. This vibration is converted to an electrical signal by the piezoelectric characteristics of the piezoelectric vibrating reed 1 and is then input to the integrated circuit 101 as the electrical signal. The input electrical signal is subjected to various kinds of processing by the integrated circuit 101 and is then output as a frequency signal. In this way, the piezoelectric vibrator 40 functions as an oscillating piece.

By selectively setting the configuration of the integrated circuit 101, for example, an RTC (Real Time Clock) module, according to the demands, it is possible to add a function of controlling the date or time for operating the device or an external device or providing the time or calendar other than a single-function oscillator for a clock.

According to the oscillator 100 of the present embodiment, since the oscillator includes the piezoelectric vibrator 40 described above, it is possible to achieve improvement in the reliability and high quality of the oscillator 100 itself. In addition to this, it is possible to obtain a highly accurate frequency signal which is stable over a long period of time.

Electronic Device

Next, an electronic device according to an embodiment of the present invention will be described with reference to FIG. 22. The present embodiment will be described by way of an example of a portable information device 110 having the piezoelectric vibrator 40 as an example of the electronic device. It should be noted that the piezoelectric vibrator 60 may be incorporated into the portable information device.

First, the portable information device 110 of the present embodiment is represented, for example, by a cellular phone and is one that developed and improved a wristwatch of the related art. The portable information device 110 looks like a wristwatch in external appearance and is provided with a liquid crystal display at a portion corresponding to the dial pad and is capable of displaying the current time or the like on the screen. When the portable information device 110 is used as a communication tool, the user removes it from the wrist and makes communications as with a cellular phone of the related art using the internal speaker and microphone on the inner side of its strap. However, the portable information device 110 is remarkably small and light compared with the cellular phone of the related art. Next, the configuration of the portable information device 110 of the present embodiment will be described.

Figure 22:
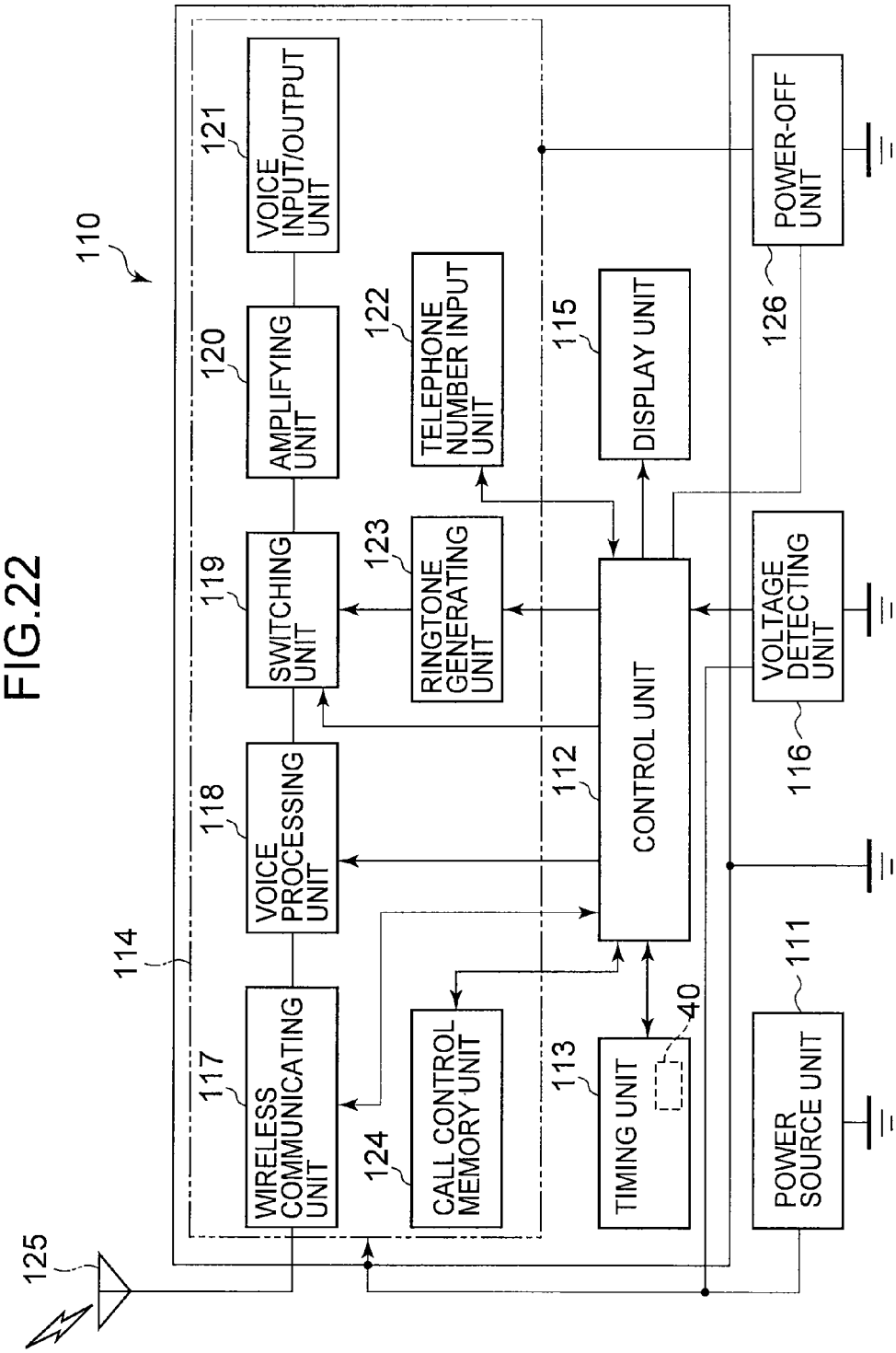
FIG. 22 is a view showing the configuration of an electronic device according to an embodiment of the present invention.

As shown in FIG. 22, the portable information device 110 includes the piezoelectric vibrator 40 and a power supply portion 111 for supplying power. The power supply portion 111 is formed, for example, of a lithium secondary battery. The power supply portion 111 is connected in parallel to a control portion 112 that performs various kinds of control, a time counting portion 113 that counts the time or the like, a communication portion 114 that makes communications with the outside, a display portion 115 that displays various kinds of information, and a voltage detection portion 116 that detects voltages at the respective function portions. The power supply portion 111 supplies power to the respective functional portions.

The control portion 112 controls the respective function portions so as to control operations of the overall stem 64, such as operations to transmit and receive sound data and operations to count and display the current time. The control portion 112 includes a ROM in which a program is written in advance, a CPU that reads out and runs the program written to the ROM, a RAM used as a work area of the CPU, and the like.

The time counting portion 113 includes an integrated circuit enclosing an oscillation circuit, a register circuit, a counter circuit, and an interface circuit, and the like as well as the piezoelectric vibrator 40. When a voltage is applied to the piezoelectric vibrator 40, the piezoelectric vibrating reed 1 vibrates, and this vibration is converted to an electrical signal by the piezoelectric characteristics of the quartz and is input to the oscillation circuit as the electrical signal. The output of the oscillation circuit is converted to a digital form and counted by the register circuit and the counter circuit. Signals are transmitted and received to and from the control portion 112 via the interface circuit, and the current time and the current date or the calendar information or the like are displayed on the display portion 115.

The communication portion 114 is provided with the same functions as those of the cellular phone of the related art, and includes a wireless portion 117, a sound processing portion 118, a switching portion 119, an amplifier portion 120, a sound input/output portion 121, a telephone number input portion 122, a ring tone generation portion 123, and a call control memory portion 124.

The wireless portion 117 carries out transmission and reception of various kinds of data, such as sound data, with the base station via an antenna 125. The sound processing portion 118 encodes and decodes a sound signal input therein from the wireless portion 117 or the amplifier portion 120. The amplifier portion 120 amplifies a signal input therein from the sound processing portion 118 or the sound input/output portion 121 to a predetermined level. The sound input/output portion 121 is formed of a speaker and a microphone, and makes a ring tone and an incoming sound louder as well as collects sounds.

The ring tone generation portion 123 generates a ring tone in response to a call from the base station. The switching portion 119 switches the amplifier portion 120 normally connected to the sound processing portion 118 to the ring tone generation portion 123 only when a call arrives, so that the ring tone generated in the ring tone generation portion 123 is output to the sound input/output portion 121 via the amplifier portion 120.

The call control memory portion 124 stores a program relating to incoming and outgoing call control for communications. The telephone number input portion 122 includes, for example, numeric keys from 0 to 9 and other keys and the user inputs the telephone number of the communication party by depressing these numeric keys.

The voltage detection portion 116 detects a voltage drop when a voltage being applied to each function portion, such as the control portion 112, by the power supply portion 111 drops below the predetermined value, and notifies the control portion 112 of the detection. The predetermined voltage value referred to herein is a value pre-set as the lowest voltage necessary to operate the communication portion 114 in a stable manner, and for example, about 3 V. Upon receipt of a notification of a voltage drop from the voltage detection portion 116, the control portion 112 disables the operation of the wireless portion 117, the sound processing portion 118, the switching portion 119, and the ring tone generation portion 123. In particular, it is essential to stop the operation of the wireless portion 117 that consumes a large amount of power. Furthermore, a message informing that the communication portion 114 becomes unavailable due to insufficient battery power is displayed on the display portion 115.

More specifically, it is possible to disable the operation of the communication portion 114 and display the notification message on the display portion 115 by the voltage detection portion 116 and the control portion 112. This message may be displayed as a character message, or as a more intuitive indication, which may be displayed by putting a cross mark on the telephone icon displayed at the top of the display screen of the display portion 115.

By providing a power shutdown portion 126 capable of selectively shutting down the power supply to portions involved with the function of the communication portion 114, it is possible to stop the function of the communication portion 114 in a more reliable manner.

According to the portable information device 110 of the present embodiment, since the portable information device includes the piezoelectric vibrator 40 described above, it is possible to achieve improvement in the reliability of the portable information device itself and high quality. In addition to this, it is possible to display highly accurate clock information which is stable over a long period of time.

Radio-Controlled Clock

Figure 23:
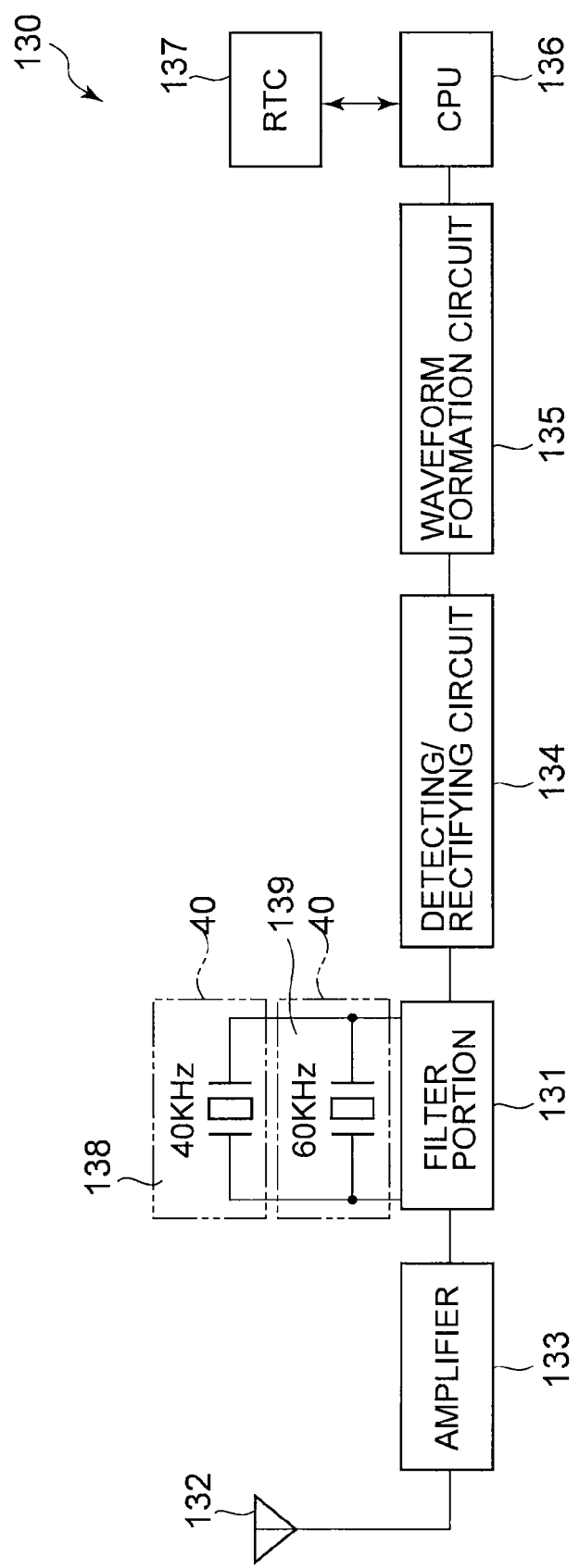
FIG. 23 is a view showing the configuration of a radio-controlled clock according to an embodiment of the present invention.
Figure 24:
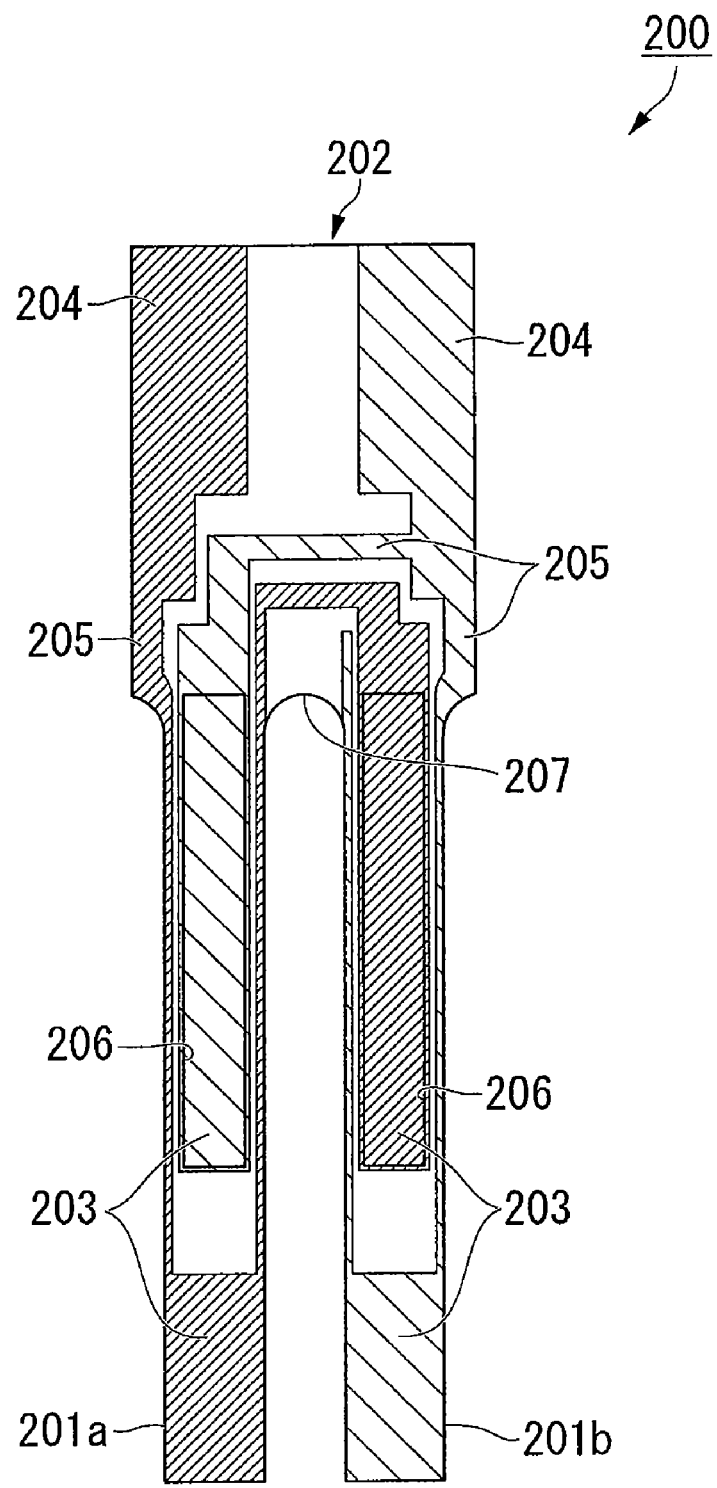
FIG. 24 is a top view showing an example of a piezoelectric vibrating reed according to the related art.
Figure 25:
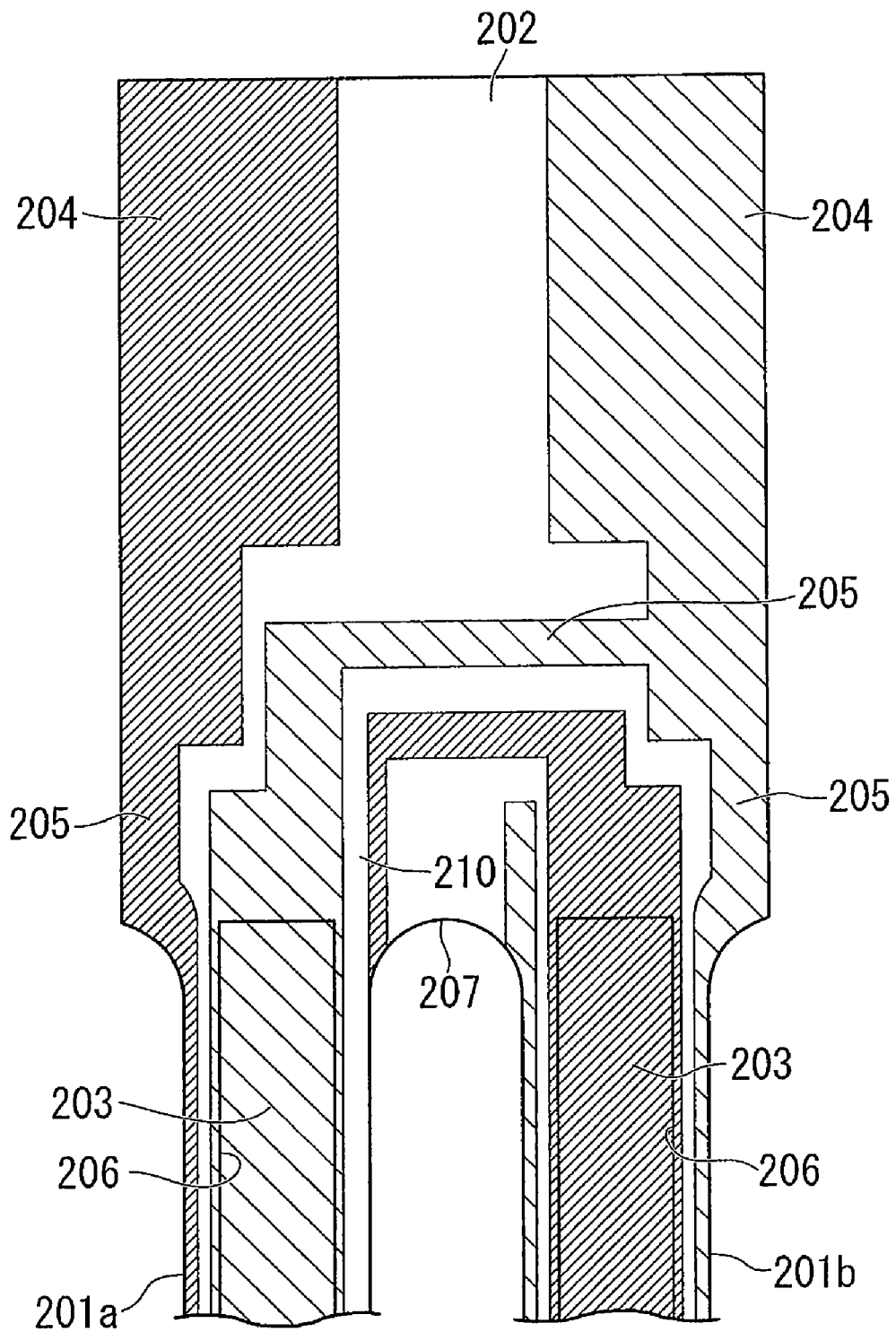
FIG. 25 is a view showing a state where a portion of an excitation electrode is disconnected at a fork portion at the time of manufacturing the piezoelectric vibrating reed shown in FIG. 24.

Next, a radio-controlled clock 130 according to an embodiment of the present invention will be described with reference to FIG. 23. As shown in FIG. 23, the radio-controlled clock 130 of the present embodiment includes the piezoelectric vibrators 40 electrically connected to a filter portion 131. The radio-controlled clock 130 is a clock provided with the function of displaying the correct time by automatically correcting the time upon receipt of a standard radio wave including the clock information. It should be noted that the piezoelectric vibrator 60 may be incorporated into the radio-controlled clock.

In Japan, there are transmission centers (transmission stations) that transmit a standard radio wave in Fukushima Prefecture (40 kHz) and Saga Prefecture (60 kHz), and each center transmits the standard radio wave. A wave as long as 40 kHz or 60 kHz has a nature to propagate along the land surface and a nature to propagate while reflecting between the ionospheric layer and the land surface, and therefore has a propagation range wide enough to cover all Japan by the two transmission centers.

Hereinafter, the functional configuration of the radio-controlled clock 130 will be described in detail.

An antenna 132 receives the long standard radio wave at 40 kHz or 60 kHz. The long standard radio wave is made up of time information called a time code which is modulated by the AM modulation scheme and carried on a carrier wave of 40 kHz or 60 kHz. The received long standard wave is amplified by an amplifier 133 and filtered and synchronized by the filter portion 131 having a plurality of piezoelectric vibrators 40.

In the present embodiment, the piezoelectric vibrators 40 include quartz vibrator portions 138 and 139 having resonance frequencies at 40 kHz and 60 kHz which are the same as the carrier frequency.

Furthermore, the filtered signal at the predetermined frequency is detected and demodulated by a detection and rectification circuit 134. Subsequently, the time code is extracted by a waveform shaping circuit 135 and counted by the CPU 136. The CPU 136 reads out information about the current year, the total number of days, a day of the week, and the time. The read information is reflected on the RTC 137 and the precise time information is displayed.

Because the carrier wave is 40 kHz or 60 kHz, a vibrator having the tuning-fork structure described above is suitable for the quartz vibrator portions 138 and 139.

Although the above description has been given to the example in Japan, the frequency of the long standard wave is different overseas. For example, a standard wave of 77.5 kHz is used in Germany. When the radio-controlled clock 130 operable as well overseas is incorporated into a portable device, the piezoelectric vibrator 40 set at the frequency different from the frequencies used in Japan is required.

According to the radio-controlled clock 130 of the present embodiment, since the radio-controlled clock includes the piezoelectric vibrator 40 described above, it is possible to achieve improvement in the reliability of the radio-controlled clock itself and high quality. In addition to this, it is possible to count the time highly accurately and stably over a long period of time.

It should be noted that the technical scope of the present invention is not limited to the embodiments above, and the present invention can be modified in various ways without departing from the spirit of the present invention.

For example, although the embodiment has been described that the length of the large-width portion 22a is set to a range of 100 and 200 µm from the fork portion 15 to the tip ends of the vibrating arms 3 and 4, the length is not limited to this range. Moreover, although the horizontal width of the large-width portion 22a has been described as 10 µm, the width may be greater than 10 µm. The length and horizontal width of the large-width portion 22a may be designed to have an optimum size depending on the dimensions of the vibrating arms 3 and 4 and the groove portions 6. However, the horizontal width of the large-width portion 22a is preferably set to at least 10 µm considering the typical exposure position accuracy.

What is claimed is:

1. A piezoelectric vibrating reed having two arms extensive in parallel and having proximal ends connected to a base, each arm having opposite principal surfaces and opposite side surfaces, and each principal surface being formed with a groove elongated in a direction of the arm, the piezo electric vibrating reed comprising:

a principal electrode layered at least in part on a respective principal surface and elongated in the direction of the arm, wherein the principal electrode has at least a first section and a second section defined along its length from a side of the proximal end, and the first section has a width narrower in a plane view than that of the second section; and a side electrode layered at least in part on a respective side surface and extensive to cover peripheries of the principal surfaces continuous from the respective side surface, wherein the side electrode layered on at least one of the side surfaces of a respective arm has a wide section extensive at least partially along the first section of the principal electrode so as to cover the periphery of a respective principal surface widely in the plain view than the other section of the side electrode, taking advantage of the narrower width of the first section of the principal electrode.

2. The piezoelectric vibrating reed according to claim 1, wherein the wide section of the side electrode is extensive in the direction of the arm within a range between 100 μm and 200 μm.

3. The piezoelectric vibrating reed according to claim 1, wherein the wide section of the side electrode covers the periphery of the respective principal surface in a width of at least 10 μm.

4. A piezoelectric vibrator comprising the piezoelectric vibrating reed according to claim 1.

5. The piezoelectric vibrator according to claim 4, comprising:
   a base substrate on which the piezoelectric vibrating reed is mount;
   a lid substrate bonded to the base substrate so that the piezoelectric vibrating reed is enclosed in a cavity formed in the bonded base and lid substrates; and
   outer electrodes formed in a lower surface of the base substrate for supply electricity to vibrate the piezoelectric vibrating reed.

6. The piezoelectric vibrator according to claim 4, comprising:
   a casing that encloses the piezoelectric vibrating reed inside thereof;
   an annular stem fixed to the casing;
   two lead terminals extensive through the stem, the lead terminals having inner leads electrically connected to the piezoelectric vibrating reed, and outer leads extensive on the opposite side of the inner leads; and
   a filler that fills a step to fix the lead terminals.

7. An oscillator comprising the piezoelectric vibrator according to claim 4, which is connected to an integrated circuit of the oscillator.

8. An electronic device comprising:
   a clock; and
   the piezoelectric vibrator according to claim 4 electrically connected to the clock.

9. A radio-controlled clock comprising:
   a filter; and
   the piezoelectric vibrator according to claim 4 electrically connected to the filter.

* * * * *